(12) United States Patent
Luan

(10) Patent No.: US 12,230,619 B2
(45) Date of Patent: Feb. 18, 2025

(54) LOW PROFILE SENSOR PACKAGES

(71) Applicant: STMICROELECTRONICS PTE LTD, Singapore (SG)

(72) Inventor: Jing-En Luan, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 304 days.

(21) Appl. No.: 17/714,822

(22) Filed: Apr. 6, 2022

(65) Prior Publication Data

US 2022/0352133 A1 Nov. 3, 2022

Related U.S. Application Data

(60) Provisional application No. 63/181,884, filed on Apr. 29, 2021.

(51) Int. Cl.
*H01L 25/16* (2023.01)
*H01L 21/56* (2006.01)
*H01L 23/00* (2006.01)
*H01L 23/31* (2006.01)
*H01L 23/538* (2006.01)

(52) U.S. Cl.
CPC .......... *H01L 25/167* (2013.01); *H01L 21/568* (2013.01); *H01L 23/3157* (2013.01); *H01L 23/5386* (2013.01); *H01L 24/48* (2013.01); *H01L 2224/48157* (2013.01)

(58) Field of Classification Search
CPC . H01L 25/167; H01L 21/568; H01L 23/3157; H01L 23/5386; H01L 24/48; H01L 2224/48157; H10B 80/00
See application file for complete search history.

(56) References Cited

U.S. PATENT DOCUMENTS

| | | |
|---|---|---|
| 7,617,980 B2 | 11/2009 | Saxena et al. |
| 8,324,602 B2 | 12/2012 | Wiese et al. |
| 8,779,361 B2 | 7/2014 | Costello et al. |
| 9,130,109 B2 | 9/2015 | Makimura et al. |
| 9,177,884 B2 | 11/2015 | Schunk |
| 10,061,057 B2 | 8/2018 | Wong et al. |
| 2011/0024916 A1* | 2/2011 | Marimuthu ............. H01L 24/24 257/E21.511 |
| 2019/0189859 A1 | 6/2019 | Riviere et al. |
| 2019/0190606 A1 | 6/2019 | Riviere et al. |

* cited by examiner

Primary Examiner — Timor Karimy
(74) Attorney, Agent, or Firm — Seed IP Law Group LLP

(57) ABSTRACT

The present disclosure is directed to embodiments of optical sensor packages. For example, at least one embodiment of an optical sensor package includes a light-emitting die, a light-receiving die, and an interconnect substrate within a first resin. A first transparent portion is positioned on the light-emitting die and the interconnect substrate, and a second transparent portion is positioned on the light-receiving die and the interconnect substrate. A second resin is on the first resin, the interconnect substrate, and the first and second transparent portions, respectively. The second resin partially covers respective surfaces of the first and second transparent portions, respectively, such that the respective surfaces are exposed from the second resin.

19 Claims, 11 Drawing Sheets

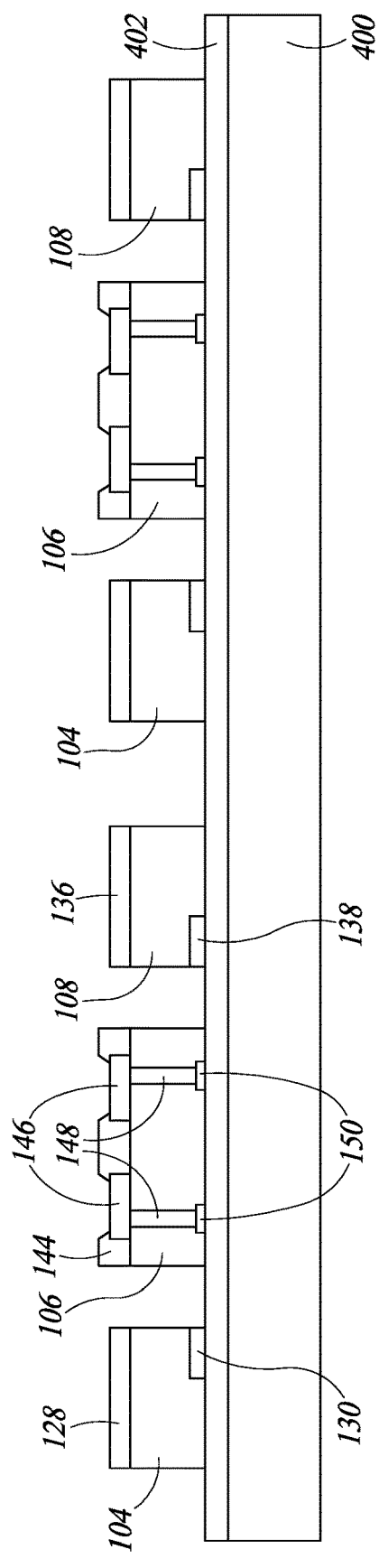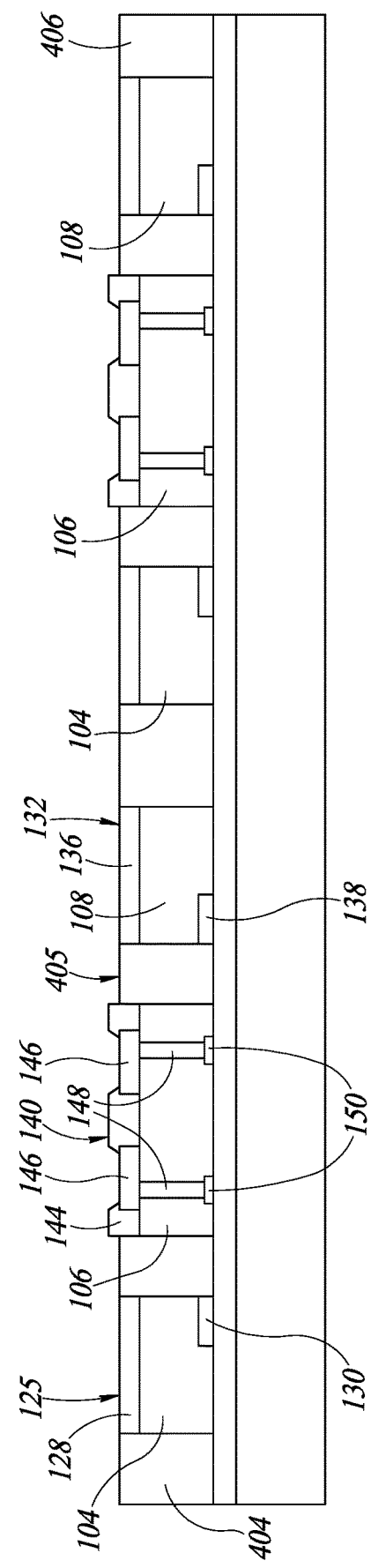

LOW PROFILE SENSOR PACKAGES

BACKGROUND

Technical Field

The present disclosure is directed to embodiments of low profile sensor packages as well as embodiments of methods of manufacturing the same.

Description of the Related Art

Generally, semiconductor device packages, such as chip scale packages or wafer level chip scale packages (WLCSPs), contain integrated circuit die encased in a molding compound. The integrated circuit die may be sensors configured to detect any number of quantities or qualities, or the integrated circuit die may be controllers (e.g., microprocessors, memory, etc.) utilized to control other various electronic components in or outside an integrated circuit die package. For example, such integrated circuit die packages may detect light, temperature, sound, pressure, stress, strain, or any other quantities or qualities.

A conventional optical sensor package may be formed to include a light-emitting die and a light-receiving die on a surface of a substrate on which a cap is present covering the light-emitting die and the light-receiving die. The cap includes openings that are aligned with the light-emitting die and the light-receiving die, respectively. A plurality of windows or lenses (e.g., transparent and transmissive portions through which light is capable of passing through) are coupled to the cap and aligned with the openings, respectively. The plurality of windows stop debris from entering the cap and reaching the light-emitting die and the light-receiving die. The plurality of windows are coupled to the cap by an adhesive and the cap is coupled to the surface of the substrate by an adhesive.

Conventional optical sensor packages that utilize the cap to protect the light-emitting die and the light-sensing die are generally costly and timely to manufacture as positioning and coupling the cap to the substrate as well as the plurality of windows to the cap requires advanced and high-precision machinery and equipment. For example, the adhesive may be applied to the substrate in a first step by a first high-precision process and the cap may then be applied to the adhesive in a second high-precision process.

The conventional optical sensor packages with the cap are susceptible to delamination between the surface of the substrate and the cap such that the cap may break away from the conventional optical sensor packages. When the cap breaks away due to delamination, the conventional optical sensor packages generally fail as the light-emitting die and the light-receiving die are eventually exposed to debris damaging the light-emitting die and the light-receiving die.

The conventional sensor packages with the cap generally have a larger profile as enough clearance between the plurality of windows, the cap, the light-emitting die, and the light-receiving die is present such that the light-emitting die and the light-receiving die do not contact the cap or the plurality of windows. This clearance between these components results in conventional optical sensor packages utilizing the cap generally being limited when reducing the overall size, shape, and footprint of the conventional optical sensor packages. In other words, a thickness and a width of the conventional optical sensor packages is generally limited by the utilization of the cap such that reducing the size, shape, and footprint becomes difficult.

BRIEF SUMMARY

The present disclosure is directed to embodiments of optical sensor packages as well as methods of manufacturing the embodiments of the optical sensor packages. At least one embodiment of an optical sensor package of the present disclosure includes a light-emitting die, a light-receiving die, and an interconnect substrate within a first resin. Respective sidewalls of the light-emitting die, the light-receiving die, and the interconnect substrate are covered by the first resin. A first transparent portion is on the light-emitting die and the interconnect substrate, and a second transparent portion is on the light-receiving die and the interconnect substrate. The first and second transparent portions are spaced apart from each other. A first electrical wire is within the first transparent portion and couples the light-emitting die to the interconnect substrate, and a second electrical wire is within the second transparent portion and couples the light-receiving die to the interconnect substrate. A second resin is on the first and second transparent portions and is on the interconnect substrate as well as the first resin. A first opening extends into the second resin to the first transparent portion and is aligned with the light-emitting die. A second opening extends into the second resin to the second transparent portion and is aligned with the light-receiving die. The first and second resins are optically non-transmissive materials (e.g., photons of light do not pass through the optically non-transmissive material), and the first and second transparent portions are optically transmissive materials (e.g., photons of light readily pass through the optically transmissive materials).

During methods of manufacturing, a dimensionality, size, and shape of the first and second transparent portions as well as the first and second resins may be selected, adapted, or adjusted to reduce the overall profile and footprint of the embodiments of the optical sensor packages of the present disclosure. For example, in at least one embodiment of a method of manufacturing the at least one embodiment of the optical sensor package, the first resin, the first and second transparent portions, and the second resin may be formed by multiple resin formation steps utilizing an injection molding technique (e.g., positioning a molding tool and injecting a resin into the molding tool forming a dimensionality, size, and shape of a resin material injected).

BRIEF DESCRIPTION OF THE SEVERAL VIEWS OF THE DRAWINGS

For a better understanding of the embodiments, reference will now be made by way of example to the accompanying drawings. In the drawings, identical reference numbers identify the same or similar elements or acts unless the context indicates otherwise. The sizes and relative proportions of the elements in the drawings are not necessarily drawn to scale. For example, some of these elements may be enlarged and positioned to improve drawing legibility.

FIGS. 4A-4E illustrate a method of manufacturing the embodiment of the optical sensor package as shown in FIGS. 1A-1C.

DETAILED DESCRIPTION

In the following description, certain specific details are set forth in order to provide a thorough understanding of various embodiments of the disclosure. However, one skilled in the art will understand that the disclosure may be practiced without these specific details. In other instances, well-known structures associated with electronic components, packages, and semiconductor fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second, third, etc., does not necessarily imply a ranked sense of order, but rather may only distinguish between multiple instances of an act or a similar structure or material.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The terms "top," "bottom," "upper," "lower," "left," and "right," are used for only discussion purposes based on the orientation of the components in the discussion of the Figures in the present disclosure as follows. These terms are not limiting as the possible positions explicitly disclosed, implicitly disclosed, or inherently disclosed in the present disclosure.

The term "substantially" is used to clarify that there may be slight differences and variation when a package is manufactured in the real world, as nothing can be made perfectly equal or perfectly the same. In other words, "substantially" means and represents that there may be some slight variation in actual practice and instead is made or manufactured within selected tolerances.

As used in this specification and the appended claims, the singular forms "a," "an," and "the" include plural referents unless the content clearly dictates otherwise.

While various embodiments are shown and described with respect to semiconductor die and semiconductor packages, it will be readily appreciated that embodiments of the present disclosure are not limited thereto. In various embodiments, the structures, devices, methods and the like described herein may be embodied in or otherwise utilized in any suitable type or form of semiconductor die or packages, and may be manufactured utilizing any suitable semiconductor die and packaging technologies as desired.

Figure 1A:
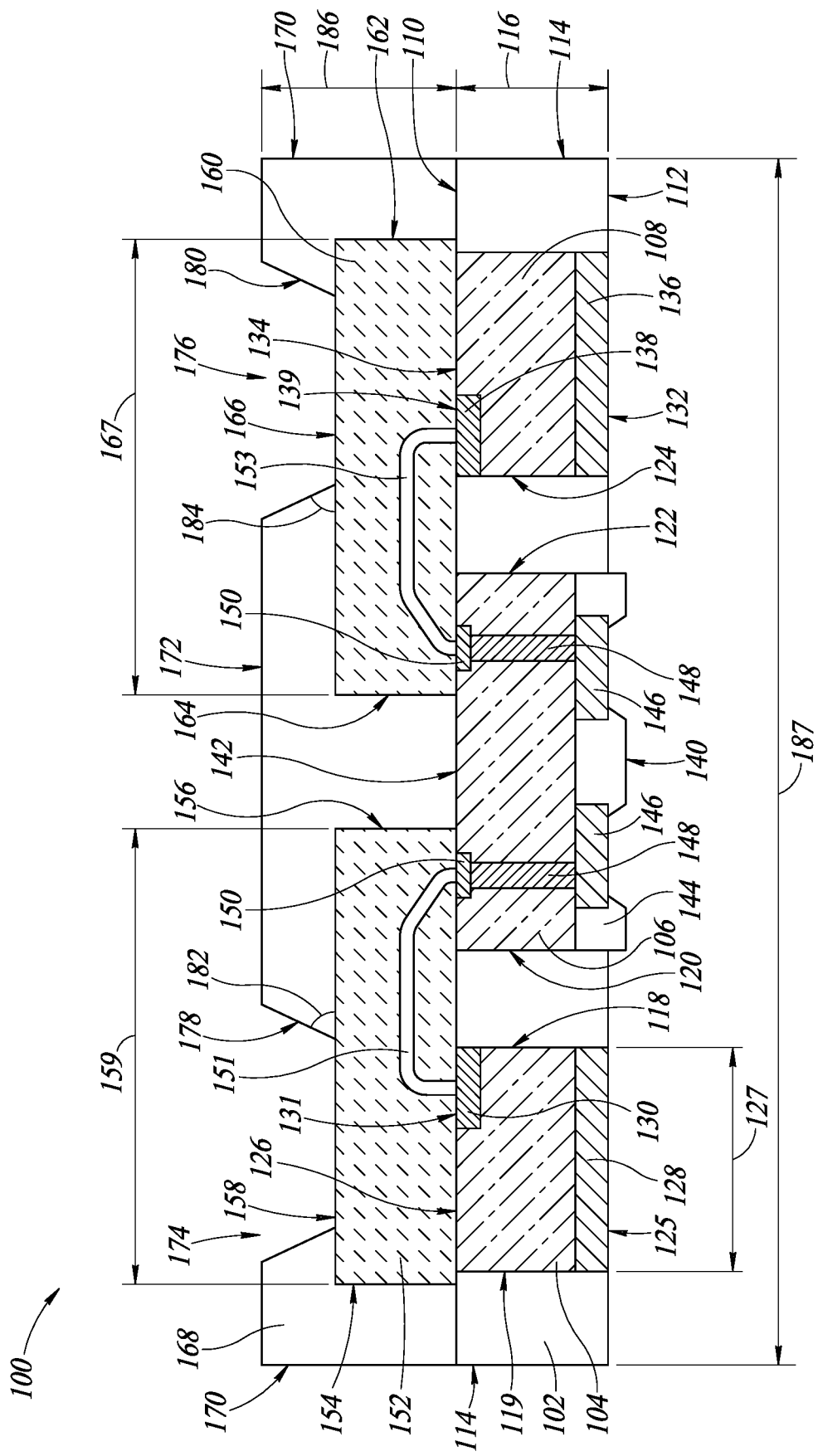
FIG. 1A illustrates a cross-sectional view of an embodiment of an optical sensor package taken along line A-A in FIG. 1B.
Figure 1B:
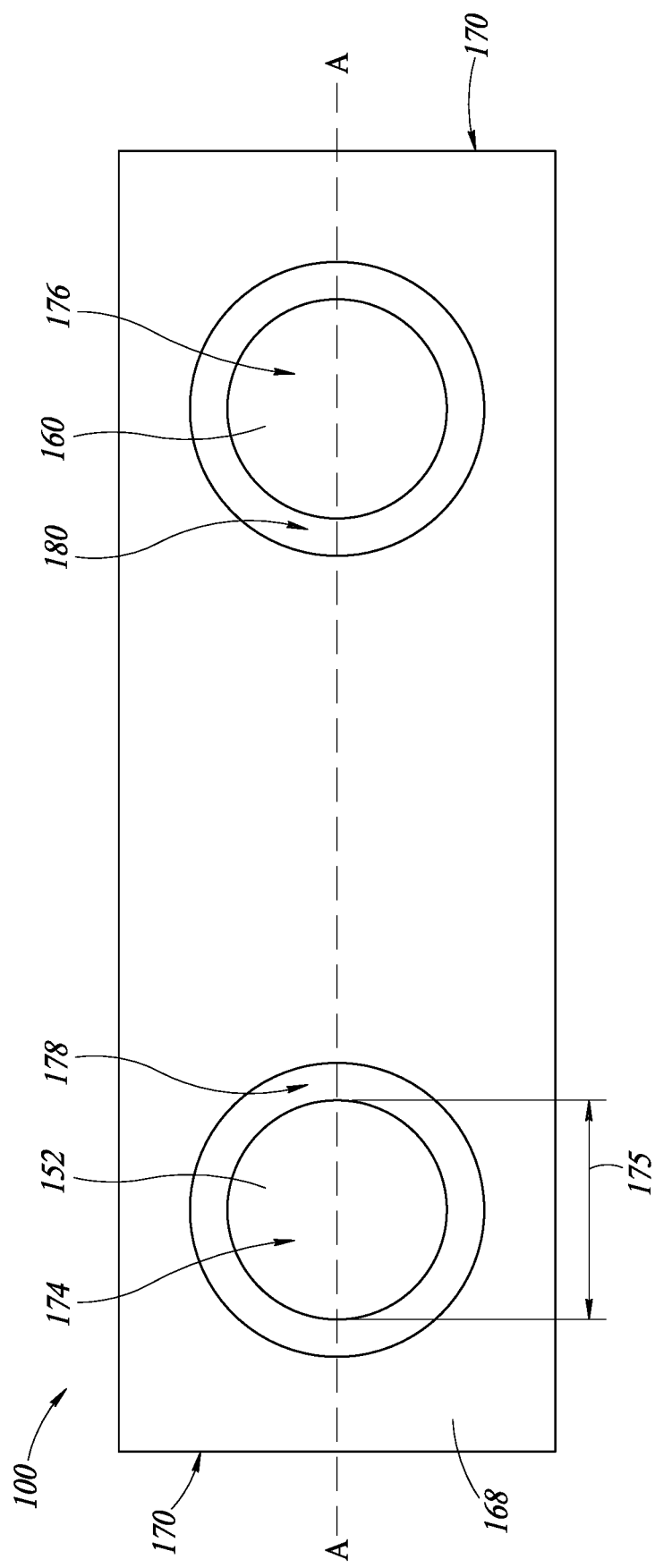
FIG. 1B illustrates a top plan view of the embodiment of the optical sensor package as shown in FIG. 1A.
Figure 1C:
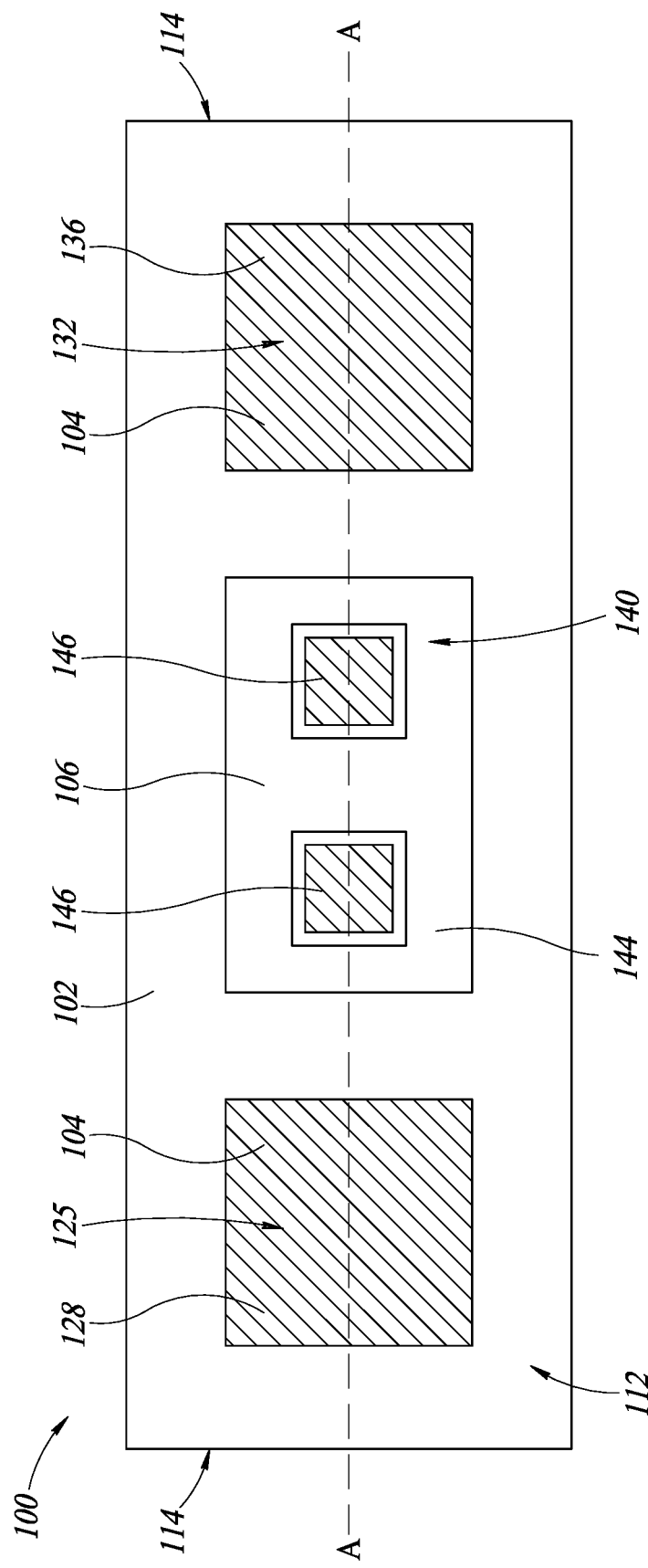
FIG. 1C illustrates a bottom plan view of the embodiment of the optical sensor package as shown in FIG. 1C.

The present disclosure illustrates embodiments of optical sensor packages including a first resin around a light-emitting die, a light-receiving die, and an interconnect substrate, which may include passive or active circuitry, electrically coupled to the light-emitting die and the light-receiving die by respective ones of a plurality of wires. A first transparent portion is on the light-emitting die, the interconnect substrate, and the first resin, and a second transparent portion is on the light-receiving die, the interconnect substrate, and the first resin. For example, one such embodiment of an optical sensor package is shown in FIGS. 1A-1C. The embodiments of the optical sensor packages, such as the one shown in FIGS. 1A-1C, are generally less costly to manufacture and have a smaller footprint (e.g., smaller in thickness, width, size, and shape) as compared to the conventional optical sensor packages as discussed earlier.

In at least one embodiment of the present disclosure, the interconnect substrate contains passive circuitry coupled to the light-emitting die and the light-receiving die by the plurality of wires. The passive circuitry (e.g., through silicon vias (TSVs), electrical connections extending through the interconnect substrate, resistors, inductors, capacitors, etc.) within the interconnect substrate couples the light-emitting die and the light-receiving die to respective ones of a plurality of external conductive pads of the interconnect substrate exposed from the first resin. The plurality of external conductive pads, the passive circuitry, and the plurality of wires are an electrical path along which electrical signals (e.g., control signals, data signals, or other types of electrical signals) pass to and from the light-emitting die and the light-receiving die, respectively. In other words, the functionality of the interconnect substrate may be the same or similar to the functionality of a Redistribution Layer (RDL) or a substrate utilized in conventional optical sensor packages.

The footprint of the embodiments of the optical sensor packages of the present disclosure, such as the one shown in FIGS. 1A-1C, are reduced as a cap not being utilized means that a clearance previously provided between a die and a cap to utilize the cap in the conventional optical sensor packages is not present in the embodiments of the optical sensor packages of the present disclosure. As discussed earlier, in embodiments of the optical sensor packages of the present disclosure, the interconnect substrate, the light-emitting die, and the light-receiving die are encased by the first resin. The first resin, the light-emitting die, the light-receiving die, and the interconnect substrate may have thicknesses that are the same or similar to each other. When the first resin, the light-emitting die, the light-receiving die, and the interconnect substrate have similar thicknesses, this similarity in the thicknesses reduces the overall footprint of the optical sensor package as compared to the conventional packages that utilized a cap. The clearance between the die and the cap in the conventional optical sensor package is not present in the embodiments of the optical sensor packages of the present disclosure, and results in these embodiments of the present disclosure having a lower and smaller profile or footprint (e.g., less thick, less wide, or more thin) as compared to conventional optical sensor packages including the cap. The lower or smaller footprint allows for the embodiments of the optical sensor packages of the present disclosure to take up less space within an electronic device as compared to the conventional optical sensor packages.

The footprint of the embodiments of the optical senor packages of the present disclosure, such as the one shown in FIGS. 1A-1C, are reduced as a separate and distinct substrate generally on which the light-emitting die and the light-receiving die are coupled is not utilized in the embodiments of the present disclosure. As discussed earlier, in embodiments of the optical sensor packages of the present disclosure, the interconnect substrate is coupled to the light-emitting die and the light-receiving die, and the interconnect substrate is within the first resin with the light-emitting die and the light-receiving die. The interconnect die has surfaces of external conductive pads exposed from the first resin through which electrical signals may pass through to reach the light-emitting die and the light-receiving die respectively. The interconnect substrate replaces the substrate on which generally the light-emitting die and the light-receiving die are stacked on in conventional optical sensor packages. The substrate of the conventional optical sensor packages not being present in the at least some of the embodiments of the present disclosure results in these embodiments of the present disclosure having a lower and smaller profile or footprint (e.g., less thick, less wide, or more thin) as compared to conventional optical sensor packages including the separate and distinct substrate.

The robustness of the optical sensor packages of the present disclosure, such as the one shown in FIGS. 1A-1C, is increased as a cap not being utilized means that a point of failure due to delamination between the cap and the substrate in the conventional optical sensor packages is not present in the embodiments of the present disclosure. The cap not being present in the embodiments of the optical sensor packages of the present disclosure results in these embodiments not having the potential failure of delamination between the cap and the substrate to which the cap is coupled. The removal of this point of failure in the embodiments of the present disclosure reduces the likelihood of failure in the embodiments of the present disclosure as compared to the conventional optical sensor packages.

The cost of manufacturing the optical sensor packages of the present disclosure, such as the one shown in FIGS. 1A-1C, is reduced as a cap not being utilized means that there are fewer steps in the manufacturing process utilizing high precision machinery as compared to a manufacturing process of conventional optical sensor packages utilizing a cap. The cap not being utilized in the embodiments of the optical sensor packages of the present disclosure results in these embodiments not having to include additional steps of attaching a cap to a substrate with a pick and place machine or additional adhesive formation steps to couple the cap to the substrate. The removal of these additional steps in the manufacturing process of the embodiments of the present disclosure as compared to the conventional optical sensor packages reduces the cost of manufacturing the embodiments of the present disclosure as compared to cost of manufacturing the conventional optical sensor packages.

FIG. 1A illustrates a cross-sectional view of an embodiment of an optical sensor package 100 taken along line A-A in FIG. 1B. The optical sensor package 100 includes a first resin 102 around a light-emitting die 104, an interconnect substrate 106, and a light-receiving die 108. The first resin 102 is on and covers respective sidewalls of the light-emitting die 104, the interconnect substrate 106, and the light-receiving die 108.

In some embodiments, the light-emitting die and the light-receiving die may be some other type of die within the first resin 102 and spaced apart from each other by the interconnect substrate 106. The light-emitting die 104 may be a first die and the light-receiving die may be a second die. The interconnect substrate 106 may be a third die.

The interconnect substrate 106 may be a substrate, a silicon substrate, a semiconductor substrate, a silicon die, a semiconductor die, an application-specific integrated circuit (ASIC) die, an integrated circuit die, or some other type of substrate or die. In some embodiments, the interconnect substrate 106 may include passive circuitry. In some embodiments, the interconnect substrate 106 may include active circuitry. These embodiments of the interconnect substrate 106 including passive circuitry, active circuitry, or both passive and active circuitry will be discussed in further detail later herein within the present disclosure.

The first resin 102 includes a first surface 110 and a second surface 112 opposite to the first surface 110. The first resin 102 includes respective sidewalls 114 that extend from the first surface 110 to the second surface 112. These respective sidewalls 114 are transverse to the first and second surfaces 110, 112 and face away from the light-emitting die 104, the interconnect substrate 106, and the light-receiving die 108. The respective sidewalls 114 have a dimension 116 that extends from the first surface 110 to the second surface 112. The dimension 116 is a thickness of the first resin 102. The dimension 116 may range from 100-micrometers (µm) to 300-micrometers (µm).

The first resin 102 extends between a respective sidewall 118 of the light-emitting die 104 to a respective first sidewall 120 of the interconnect substrate 106. The first resin 102 extends between a respective second sidewall 122 of the interconnect substrate 106 to a respective sidewall 124 of the light-receiving die 108. The first resin 102 separates the respective sidewalls 120, 122 of the interconnect substrate 106 from the respective sidewalls 118, 124 of the light-emitting die 104 and the light-receiving die 108, respectively.

The light emitting die 104 may have a dimension 127 that extends from a respective sidewall 119 opposite to the respective sidewall 118 as shown in FIG. 1A. The light-receiving die 108 may have a dimension the same or similar to the dimension 127 of the light-emitting die.

The first resin 102 is a non-conductive and optically non-transmissive material such that light (e.g., photons of light) does not pass through the first resin 102. For example, the first resin may be an opaque resin (e.g., a resin having a black pigment), an opaque molding compound, an opaque polymer compound, an opaque epoxy, or some other opaque or optically non-transmissive material.

The light-emitting die 104 includes an external surface 125 and an internal surface 126 opposite to the external surface 125. The external surface 125 is a lower surface and the internal surface 126 is an upper surface based on the orientation of the optical sensor package 100 as shown in FIG. 1A. In this embodiment of the optical sensor package 100, the external surface 125 is substantially coplanar with the second surface 112 of the first resin 102, and the internal surface 126 is substantially coplanar with the first surface 110 of the first resin 102.

The light-emitting die 104 further includes an external conductive pad 128 at the second surface 112 of the first resin 102. In this embodiment of the optical sensor package 100, the external surface 125 of the light-emitting die 104 is a surface of the external conductive pad 128. The external conductive pad 128 may be a die pad, a bond pad, a contact pad, a heat-sink pad, or some other type of conductive structure or pad. The external conductive pad 128 may be one of a plurality of conductive pads that are at the external surface 125 of light-emitting die 104.

The light-emitting die 104 further includes an internal conductive pad 130 at the internal surface 126 of the light-emitting die 104. The internal conductive pad 130 has an internal surface 131 substantially coplanar with the internal surface 126 of the light-emitting die 104 and the internal surface 110 of the first resin 102. The internal conductive pad 130 may be a bond pad, a contact pad, or some other type of conductive structure or pad. The light-emitting die 104 further includes a light-emitting component (not shown) at the internal surface 126 of the light-emitting die 104. The light-emitting component may be a light-emitting diode (LED) or some other type of light-emitting structure that may emit photons of light when powered by an electrical signal. The internal conductive pad 130 may be one of a plurality of internal conductive pads that are coupled to the interconnect substrate 106 by a plurality of electrical connections such as a plurality of wires.

The external conductive pad 128 may be in electrical communication with circuitry of the light-emitting die 104. For example, an electrical signal may be passed to and from circuitry and electrical components of the light-emitting die 104 through electrical connections extending through the light-emitting die 104 that are not shown in FIG. 1A for brevity and simplicity sake. The above discussion may apply to a plurality of external conductive pads when the external conductive pad 128 is one of the plurality external conductive pads at the external surface 125 of the light-emitting die 104.

The external conductive pad 128 may be a heat-sink. For example, the external conductive pad 128 may dissipate and transfer heat or thermal energy within the light-emitting die 104 to a location outside the light-emitting die 104 as well as outside the package 100. In other words, the external conductive pad 128 redirects heat or thermal energy within the light-emitting die 104 and the package 100 away from the light-emitting die 104 and the package 100 by having the external surface 125 exposed from the first resin 102 of the package 100. The above discussion may apply to a plurality of external conductive pads when the external conductive pad 128 is one of the plurality external conductive pads at the external surface 125 of the light-emitting die 104. The light-receiving die 108 includes an external surface 132 and an internal surface 134 opposite to the external surface 132. The external surface 132 is a lower surface and the internal surface 134 is an upper surface based on the orientation of the optical sensor package 100 as shown in FIG. 1A. In this embodiment of the optical sensor package 100, the external surface 132 is substantially coplanar with the second surface 112 of the first resin 102, and the internal surface 134 is substantially coplanar with the first surface 110 of the first resin 102. In some embodiments, the external surface 132 may be spaced outward (e.g., protrudes outward from the second surface of the first resin) from the second surface 112 of the first resin 102 or the external surface 132 may be spaced inward (e.g., recessed within the second surface of the first resin) from the second surface 112 of the first resin 102.

The light-receiving die 108 further includes an external conductive pad 136 at the second surface 112 of the first resin 102. In this embodiment of the optical sensor package 100, the external surface 125 of the light-receiving die 108 is a surface of the external conductive pad 136. The external conductive pad 136 may be a die pad, a bond pad, a contact pad, a heat-sink pad, or some other type of conductive structure or pad. The external conductive pad 136 may be one of a plurality of conductive pads that are at the external surface 132 of light-receiving die 108.

The light-receiving die 108 further includes an internal conductive pad 138 at the internal surface 134 of the light-receiving die 108. The internal conductive pad 138 has an internal surface 139 substantially coplanar with the internal surface 134 of the light-receiving die 108 and the internal surface 110 of the first resin 102. The internal conductive pad 138 may be a bond pad, a contact pad, or some other type of conductive structure or pad. The light-receiving die 108 further includes a light-receiving component (not shown in FIG. 1A through for simplicity sake). The light-receiving component may be a photo-detector or some other light-receiving or light-detecting structure or component that may detect photons of light reflected off an object outside of the optical sensor package 100 when powered by an electrical signal.

The external conductive pad 136 may be in electrical communication with circuitry of the light-receiving die 108. For example, an electrical signal may be passed to and from circuitry and electrical components of the light-receiving die 108 through electrical connections extending through the light-receiving die 108 that are not shown in FIG. 1A for brevity and simplicity sake. The above discussion may apply to a plurality of external conductive pads when the external conductive pad 136 is one of the plurality external conductive pads at the external surface 132 of the light-receiving die 108

The external conductive pad 136 may be a heat-sink. For example, the external conductive pad 136 may dissipate and transfer heat or thermal energy within the light-receiving die 108 to a location outside the light-receiving die 108 as well as outside the package 100. In other words, the external conductive pad 136 redirects heat or thermal energy within the light-receiving die 108 and the package 100 away from the light-receiving die 108 and the package 100 by having the external surface 132 exposed from the first resin 102 of the package 100. The above discussion may apply to a plurality of external conductive pads when the external conductive pad 136 is one of the plurality external conductive pads at the external surface 132 of the light-receiving die 108. The interconnect substrate 106 includes an external surface 140 and an internal surface 142 opposite to the external surface 140. The external surface 140 is a lower surface and the internal surface 142 is an upper surface based on the orientation of the optical sensor package 100 as shown in FIG. 1A. In this embodiment, the internal surface 142 is substantially coplanar with the first surface 110 of the first resin 102, and the external surface 140 is spaced outward (e.g., protrudes outward from the second surface of the first resin) from the second surface 112 of the first resin 102. In some embodiments, the external surface 140 may be substantially coplanar with the second surface 112 of the first resin 102 or the external surface 140 may be spaced inward (e.g., recessed within the second surface of the first resin) from the second surface 112 of the first resin 102.

The interconnect substrate 106 further includes a non-conductive layer 144 at the second surface 112 of the first resin 102. The external surface 140 of the interconnect substrate 106 is a surface of the non-conductive layer 144. The non-conductive layer 144 may be an insulating layer, a passivation layer, a repassivation layer, or some other type of layer that may not conduct electricity. A plurality of external conductive pads 146 of the interconnect substrate 106 are in the non-conductive layer 144. The plurality of external conductive pads 146 may be a plurality of first conductive pads, a plurality of bond pads, a plurality of contact pads, a plurality of conductive pads, or some other type of conductive structures or pads. Ones of the plurality of external conductive pads 146 are coupled to corresponding ones of a plurality of electrical connections 148 in the interconnect substrate 106. The plurality of electrical connections 148 may be through silicon vias (TSVs), conductive vias, conductive traces, or some other type of electrical connection extending through the interconnect substrate 106. Ones of the plurality of electrical connections 148 extend from corresponding ones of the plurality of external conductive pads 146 to corresponding ones of a plurality of internal conductive pads 150. The plurality of internal conductive pads 150 may be a plurality of second conductive pads, a plurality of bond pads, a plurality of contact pads, a plurality of conductive pads, or some other type of conductive structures or pads. The plurality of electrical connections 148 couple the plurality of external conductive pads 146 to the plurality of internal conductive pads 150.

The left-most internal conductive pad 150 of the interconnect substrate 106, which is based on the orientation of the optical sensor package 100 as shown in FIG. 1A, is coupled to the internal conductive pad 130 of the light-emitting die 104 by a first electrical wire 151. A first end of the first electrical wire 151 is coupled to the left-most internal conductive pad 150 of the interconnect substrate 106, and the second end of the first electrical wire 151, which is opposite to the first end, is coupled to internal conductive pad 130 of the light-emitting die 104. The first electrical wire 151 is on the internal surface 131 of the internal conductive pad 131.

The right-most internal conductive pad 150 of the interconnect substrate 106, which is based on the orientation of the optical sensor package 100 as shown in FIG. 1A, is coupled to the internal conductive pad 138 of the light-receiving die 108 by a second electrical wire 153. A first end of the second electrical wire 153 is coupled to the right-most internal conductive pad 150 of the interconnect substrate 106, and the second end of the second electrical wire 153, which is opposite to the first end, is coupled to internal conductive pad 138 of the light-receiving die 108. The second electrical wire 153 is on the internal surface 139 of the internal conductive pad 139 of the light-receiving die 108.

In at least one embodiment of the optical sensor packages 100, 200 of the present disclosure, the interconnect substrate 106 may be a silicon substrate that contains passive circuitry coupled to the light-emitting die and the light-receiving die by the first and second electrical wires 151, 153. For example, the passive circuitry may include the external conductive pads 146, the TSVs 148, and the internal conductive pads 150 of the interconnect substrate 106. Other types of passive circuitry may include electrical connections extending through the interconnect substrate 106, resistors, inductors, capacitors, or other similar passive circuitry or components within the interconnect substrate 106. The passive circuitry couples the light-emitting die 104 and the light-receiving die 108 to respective ones of the external conductive pads 150 of the interconnect substrate 106 exposed from the first resin 102.

For example, the first electrical wire 151 couples the internal conductive pad 130 to the internal conductive pad 150 on the left-hand side of the interconnect substrate 106 based on the orientation of the package 100 as shown in FIG. 1A. The TSV 148 on the left-hand side of the interconnect substrate 106 extends from the internal conductive pad 148 to the external conductive pad 146 on the left-hand side of the interconnect substrate 106 based on the orientation of the package 100 as shown in FIG. 1A. It will be readily apparent the above discussion applies in the same or similar manner to the second electrical wire 153 and the internal conductive pad 150, the TSV 148, and the external conductive pad 146 on the right-hand side of the interconnect die 106 based on the orientation of the package 100 as shown in FIG. 1A.

The passive circuitry in the interconnect substrate 106 along with the first and second electrical wires 151, 153 are an electrical path along which electrical signals (e.g., control signals, data signals, or other types of electrical signals) pass to and from the light-emitting die 104 and the light-receiving die 108, respectively. In other words, the interconnect substrate 106 may have a functionality the same or similar to a functionality as a Redistribution Layer (RDL) or a substrate utilized in other optical sensor packages.

In some embodiments, the interconnect substrate 106 may include active circuitry such as transistors or some other type of active circuitry or components. The active circuitry may be utilized in the interconnect substrate 106 in combination with the passive circuitry as discussed earlier such that the interconnect substrate 106 may provide additional functionality within the package 100.

A first transparent portion 152 is on the first resin 102, the light-emitting die 104, and the interconnect substrate 106. The first transparent portion 152 encases and surrounds the first electrical wire 151. The first transparent portion 152 is optically transmissive such that light photons pass through the first transparent portion 152. The first transparent portion 152 includes a first sidewall 154 and a second sidewall 156 opposite to the first sidewall 154. The first sidewall 154 is on the first surface 110 of the first resin 102, and the second sidewall 156 is on the internal surface 142 of the first interconnect substrate 106. The first transparent portion 152 further includes an external surface 158 that is transverse to the first and second sidewalls 154, 156, and the external surface 158 extends from the first sidewall 154 to the second sidewall 156. In this embodiment, the first transparent portion 152 entirely covers the internal surface 126 of the light-emitting die 104, and partially covers the internal surface 142 of the interconnect substrate 106. In some other embodiments, the first transparent portion 152 may instead partially cover the internal surface 126 of the light-emitting die 104. A dimension 159 extends from the first sidewall to the second sidewall. The dimension 159 may range from 500-micrometers (μm) to 1000-micrometers (μm).

A second transparent portion 160 is spaced apart from the first transparent portion 152, and the second transparent portion 160 is on the first resin 102, the light-receiving die 108, and the interconnect substrate 106. The second transparent portion 160 encases and surrounds the second electrical wire 153. The second transparent portion 160 is optically transmissive such that light photons pass through the second transparent portion 160. The second transparent portion 160 includes a third sidewall 162 and a fourth sidewall 164 opposite to the third sidewall 162. The third sidewall 162 is on the first surface 110 of the first resin 102 and the fourth sidewall 164 is on the internal surface 142 of the interconnect substrate 106. The second transparent portion 160 further includes an external surface 166 transverse to the third and fourth sidewalls 162, 164, and the external surface 166 extends from the third sidewall 162 to the fourth sidewall 164. In this embodiment, the second transparent portion 160 entirely covers the internal surface 134 of the light-receiving die 108, and partially covers the internal surface 142 of the interconnect substrate 106. In some other embodiments, the second transparent portion 160 may instead partially cover the internal surface 134 of the light-receiving die 108. A dimension 167 extends from the third sidewall 162 to the fourth sidewall 164. The dimension 167 may range from 500-micrometers (μm) to 1000-micrometers (μm).

In this embodiment of the optical sensor package 100, the dimension 159 of the first transparent portion 152 and the dimension 167 of the second transparent portion 160 are substantially equal to each other. However, in some other embodiments, the respective dimensions 159, 167 of the first and second transparent portions 152, 160, respectively, may be different from each other. For example, the dimension 159 may be larger than the dimension 167 or the dimension 159 may be smaller than the dimension 167.

A second resin 168 is on the first resin 102, the interconnect substrate 106, the first transparent portion 152, and the second transparent portion 160. The second resin 168 is a non-conductive and optically non-transmissive material such that light (e.g., photons of light) does not pass through the second resin 168. For example, the second resin 168 may be an opaque resin, an opaque molding compound, an opaque polymer compound, an opaque epoxy, or some other opaque or optically non-transmissive material. The second resin 168 includes respective sidewalls 170 and a surface 172 that is transverse to the respective sidewalls 170 of the second resin 168. The surface 172 of the second resin 168 faces away from the light-emitting die 104, the light-receiving die 108, the interconnect substrate 106, and the first and second transparent portions 152, 160, respectively. The respective sidewalls 170 of the second resin 168 are substantially coplanar with corresponding ones of the respective sidewalls 114 of the first resin 102. For example, the respective sidewall 114 of the first resin 102 at the left-hand side of the optical sensor package 100 is substantially coplanar with the respective sidewall 170 of the second resin 168 at the left-hand side of the optical sensor package 100. The second resin 168 partially covers the respective external surfaces 158, 166 of the first and second transparent portions 152, 160, respectively.

A first opening 174 extends into the second resin 168 to the first transparent portion 152. The first opening 174 is aligned with the light-emitting die 104 such that photons of light emitted by the light-emitting die 104 pass through the first transparent portion 152 and through the opening 174 to be emitted from the optical sensor package 100. As can be seen in FIG. 1B, the first opening 174 includes a dimension 175 or a diameter that may be less than the dimension 127 of the light-emitting die 104 as shown in FIG. 1A. The second opening 176 may have a dimension the same or similar to the dimension 175 of the first opening 174.

A second opening 176 extends into the second resin 168 to the second transparent portion 160. The second opening 176 is aligned with the light-receiving die 108 such that photons of light reflected off an object outside the optical sensor package 100 passes through the second opening 176 and the second transparent portion 160 to enter the optical sensor package 100 and reach the light-receiving die 108. The light-receiving die 108 then detects the photons of light reflected off the object, which were caused by the photons of light originally emitted from the light-emitting die 104 and then reflected off the object outside the optical sensor package 100. For example, the optical sensor package 100 may be a time-of-flight (TOF) sensor, a proximity sensor, a distance sensor, or some other sensor that may detect how close or far away (e.g., distance or proximity) the object is to or from the optical sensor package 100.

The second resin 168 further includes a first angled surface 178 surrounding the first opening 174 and a second angled surface 180 surrounding the second opening 176. The first angled surface 178 extends from the surface 172 of the second resin 168 to the external surface 158 of the first transparent portion 152. The second angled surface 180 extends from the surface 172 of the second resin 168 to the external surface 166 of the second transparent portion 160. The first angled surface 178 is at a first angle 182 relative to the external surface 158 of the first transparent portion 152. The second angled surface 180 is at a second angle 184 relative to the external surface 166 of the second transparent portion 160. In this embodiment, the first and second angles 182, 184 are acute angles (less than 90 degrees) that may be substantially the same relative to each other. In some embodiments, the first and second angled surfaces 178, 180 may be perpendicular to the external surfaces 158, 166 of the first and second transparent portions 152, 160, respectively, such that the first and second angles 182, 184 are substantially 90-degrees. In some embodiments, the first and second angles 182, 184 may be different angles relative to each other.

The respective sidewalls 170 of the second resin 168 have a dimension 186 that extends from the first surface 110 of the first resin 102 to the surface 172 of the second resin 168. The dimension 186 may be a thickness of the second resin 168. A summation of the dimension 116 of the first resin 102 and the dimension 186 of the second resin 168 may be less than 800-micrometers (μm). The summation of the respective dimensions 116, 186 of the first and second resins 102, 168, respectively, may range from 350-micrometers (μm) to 800-micrometers (μm). The summation of the respective dimensions 116, 186 of the first and second resins 102, 168, respectively, may preferably range from 350-micrometers (μm) to 600-micrometers (μm) to reduce the overall footprint of profile of the optical sensor package 100 as shown in FIGS. 1A-1C.

A dimension 187 of the optical sensor package 100 as shown in FIG. 1A extends from ones of the respective sidewalls 114, 170 of the first and second resins 102, 168, respectively, to opposite ones of the respective sidewalls 114, 170 of the first and second resins 102, 168, respectively. For example, the dimension 187 extends from the left-most respective sidewalls 114, 170 of the first and second resins 102, 168, respectively, to the right-most respective sidewalls 114, 170 of the first and second resins 102, 168, respectively. The dimension 187 may range from 1.4-millimeters (mm) to 3.0-millimeters (mm).

FIG. 1B illustrates a top plan view of the optical sensor package 100 as shown in FIG. 1A. In this embodiment, the first and second openings 174, 176 are circular in shape. In some other embodiments, the first and second openings 174, 176 may be square, rectangular, or polygonal in shape.

FIG. 1C illustrates a bottom plan view of the optical sensor package 100 as shown in FIG. 1A. In this embodiment, the respective conductive pads 128, 136 of the light-emitting die 104 and the light-receiving die 108 are larger than the conductive pads 146 of the interconnect substrate 106. In some other embodiments, the conductive pads 146 of the interconnect substrate 106 may be more similar or larger in size as compared to the respective conductive pads 128, 136 of the light-emitting die 104 and the light-receiving die 108.

The optical sensor package 100 may be mounted within an electronic device (e.g., a smartphone, a smart tablet, a computer, a calculator, or some other type of electronic device) or coupled to a printed circuit board that is mounted within an electronic device. When mounting or coupling the optical sensor package 100 as shown in FIGS. 1A-1C within the electronic device or to the PCB, solder balls or solder paste may couple respective surfaces of the respective conductive pads 128, 136, 146 of the light-emitting die 104, the interconnect substrate 106, and the light-receiving die 108, respectively, to respective conductive pads of the substrate or the PCB.

Figure 2:
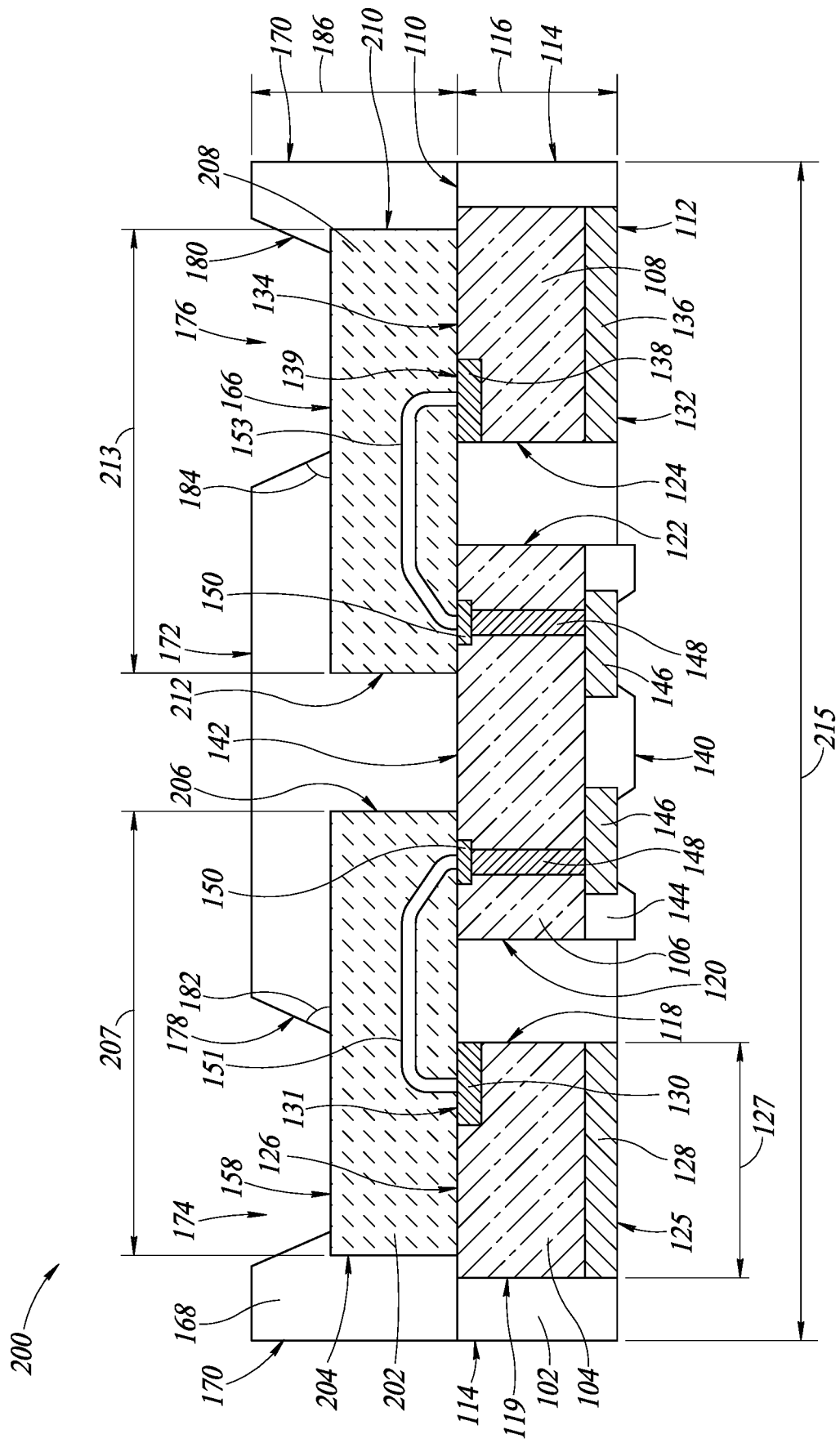
FIG. 2 illustrates a cross-sectional view of an alternative embodiment of an optical sensor package.

FIG. 2 illustrates a cross-sectional view of an alternative embodiment of an optical sensor package 200, which is similar to the optical sensor package 100 as shown in FIG. 1A. For the sake or simplicity of the present disclosure, only differences or additional features present in the optical sensor package 200 as compared to the optical sensor package 100 will be discussed in further detail herein. Furthermore, the same reference numerals will be utilized for features in the optical sensor package 200 as shown in FIG. 2 that are the same or similar to the features of the optical sensor package 100 as shown in FIGS. 1A-1C.

The left-most respective sidewalls 114, 170 of the first and second resins 102, 168, respectively, are closer to the light-emitting die 104 in the optical sensor package 200 as shown in FIG. 2 as compared to the left-most respective sidewalls 114, 170 of the first and second resins 102, 168, respectively, as in the optical sensor package 100 as shown in FIGS. 1A-1C. The right-most respective sidewalls 114, 170 of the first and second resins 102, 168, respectively, are closer to the light-receiving die 108 in the optical sensor package 200 as shown in FIG. 2 as compared to the right-most respective sidewalls 114, 170 of the first and second resins 102, 168, respectively, as in the optical sensor package 100 as shown in FIG. 1A. In other words, a footprint of embodiments of optical sensor packages 100, 200 may be reduced by reducing the dimension 187 extending between opposites ones of the respective sidewalls 114, 170 of the first and second resins 102, 168. The reduced footprint of embodiments of optical sensor packages 100, 200 reduces the area or space the embodiments of optical sensor packages 100, 200 fill in an electronic device (e.g., computer, calculator, smartphone, smart tablet, etc.), take up on a printed circuit board, or fill or take up in or on some other type of mounting or electronic component.

A first transparent portion 202 in the optical sensor package 200 is on the internal surface 126 of the light-emitting die 104, on the internal surface 142 of the interconnect substrate 106, on the first surface 110 of the first resin 102, and surrounds and encases the first electrical wire 151. The first transparent portion 202 in the optical sensor package 200 is similar to the first transparent portion 152 in the optical sensor package 100 as shown in FIG. 1A. However, unlike the first transparent portion 152 as in the optical sensor package 100, the first transparent portion 202 includes a first sidewall 204 on the internal surface 126 of the light-emitting die 104, and a second sidewall 206 opposite to the first sidewall 204 on the internal surface 142 of the interconnect substrate 106. A dimension 207 extends from the first sidewall 204 to the second sidewall 206 of the first transparent portion. The dimension 207 may range from 500-micrometers (μm) to 1000-micrometers (μm).

A second transparent portion 208 in the optical sensor package 200 is on the internal surface 134 of the light-receiving die 108, on the internal surface 142 of the interconnect substrate 106, on the first surface 110 of the first resin 102, and surrounds and encases the second electrical wire 153. The second transparent portion 208 in the optical sensor package 200 is similar to the second transparent portion 160 in the optical sensor package 100 as shown in FIG. 1A. However, unlike the second transparent portion 160 as in the optical sensor package 100, the second transparent portion 208 includes a third sidewall 210 on the internal surface 134 of the light-receiving die 108, and a fourth sidewall 212 opposite to the third sidewall 210 on the internal surface 142 of the interconnect substrate 106. The fourth sidewall 212 of the second transparent portion 208 faces towards the second sidewall 206 of the first transparent portion 202 and is spaced apart from the second sidewall 206 of the first transparent portion 202. A dimension 213 extends from the third sidewall 210 to the fourth sidewall 212 of the second transparent portion 208. The dimension 213 may range from 500-micrometers (μm) to 1000-micrometers (μm).

In this embodiment of the optical sensor package 200, the dimension 207 of the first transparent portion 202 and the dimension 213 of the second transparent portion 208 are substantially equal to each other. However, in some other embodiments, the respective dimensions 207, 213 of the first and second transparent portions 202, 208, respectively, may be different from each other.

In this embodiment of the optical sensor package 200, the respective dimensions 207, 213 of the first and second transparent portions 202, 208, respectively, are less than the respective dimensions 159, 167 of the first and second transparent portions 152, 160 in the optical sensor package 100 as shown in FIG. 1A.

A dimension 215 of the optical sensor package 200 as shown in FIG. 2 extends from ones of the respective sidewalls 114, 170 of the first and second resins 102, 168, respectively, to opposite ones of the respective sidewalls 114, 170 of the first and second resins 102, 168, respectively. For example, the dimension 215 extends from the left-most respective sidewalls 114, 170 of the first and second resins 102, 168, respectively, to the right-most respective sidewalls 114, 170 of the first and second resins 102, 168, respectively. The dimension 215 of the optical sensor package 200 as shown in FIG. 2 is less than the dimension 187 of the optical sensor package 100 as shown in FIG. 1A. The dimension 215 may range from 1.4-millimeters (mm) to 3.0-millimeters (mm).

The respective dimensions 159, 167, 207, 213 of the respective first and second transparent portions 152, 160, 202, 208 of the optical sensor packages 100, 200, respectively, as shown in FIGS. 1A-1C and 2 may be selected to reduce an overall footprint of the optical sensor packages 100, 200. By reducing the respective dimensions 159, 167, 207, 213 of the respective first and second transparent portions 152, 160, 202, 208 in the respective optical sensor packages 100, 200 as shown in FIGS. 1A-1C and 2, the overall profile or footprint of the optical sensor packages 100, 200 is reduced as compared to conventional optical sensor packages that utilize a cap instead of the first and second resins. The optical sensor packages 100, 200 are smaller as compared to conventional optical sensor packages that utilize a cap as a clearance is provided between a cap and a die on a substrate of a conventional optical sensor package, whereas no clearance is provided in the optical sensor packages 100, 200 as shown in FIGS. 1A-1C and 2 of the present disclosure. No clearance is provided in the optical sensor packages 100, 200 as the first and second resins 102, 168 are applied to the respective die 104, 106, 108 and the respective transparent portions 152, 160, 202, 208 of the optical sensor packages 100, 200 replacing the cap of conventional optical sensor packages.

FIGS. 3A-3D illustrate cross-sectional views of steps in a method of manufacturing the interconnect substrate 106 utilized in the optical sensor packages 100, 200 as shown in FIGS. 1A-1C and FIG. 2.

Figure 3A:
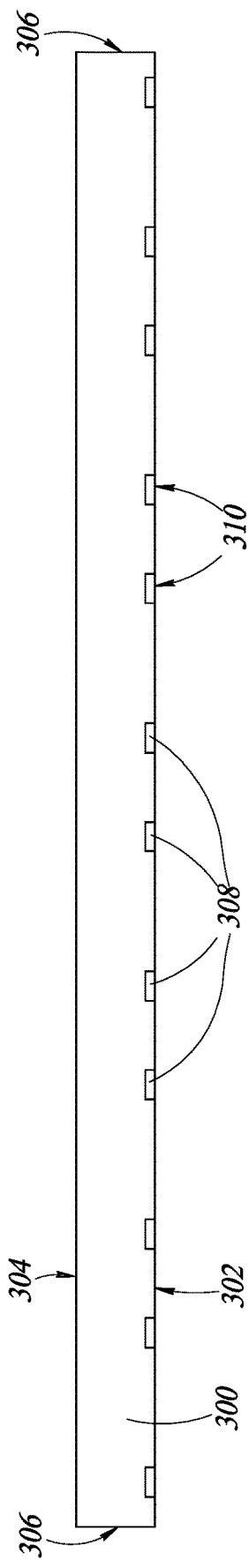
FIGS. 3A-3D illustrate a method of manufacturing an embodiment of an interconnect substrate utilized in the embodiments of the optical sensor packages as shown in FIGS. 1A-1C and 2.

FIG. 3A illustrates a cross-sectional view of a substrate 300 having a first surface 302 and a second surface 304 opposite to the first surface 302. The first surface 302 is a lower surface and the second surface 304 is an upper surface based on the orientation in FIG. 3A.

Respective sidewalls 306 of the substrate 300 extend from the first surface 302 to the second surface 304 of the substrate 300 and are transverse to the first and second surfaces 302, 304 of the substrate 300. The substrate 300 may be a P-type wafer, an N-type wafer, a silicon wafer, a semiconductor wafer, or some other type of material or substrate.

A plurality of conductive pads 308 are at the first surface 302 of the substrate 300. The plurality of conductive pads 308 correspond to the conductive pads 150 of the interconnect substrate 106 as shown in FIGS. 1A-1C and 2. The plurality of conductive pads 308 have surfaces 310 that are exposed at the first surface 302 of the substrate 300, and the surfaces 310 of the plurality of conductive pads 308 are substantially coplanar with the first surface 302 of the substrate 300. The surfaces 310 of the plurality of conductive pads 308 may be contact surfaces, bond surfaces, end surfaces, or some other type of surface at the first surface 302 of the substrate 300.

Figure 3B:
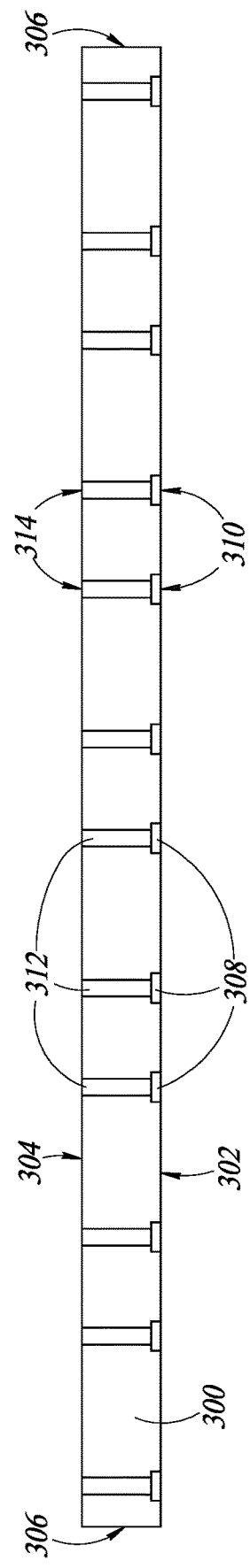

FIG. 3B illustrates a cross-sectional view of a step in the method of manufacturing the interconnect substrate 106 in which a plurality of electrical connections 312 are formed extending into the second surface 304 of the substrate 300. Ones of the plurality of electrical connections 312 extend to corresponding ones of the plurality of conductive pads 308. The plurality of electrical connections 312 correspond to the plurality of electrical connections 148 as discussed earlier with respect to the embodiments of the optical sensor packages 100, 200 as shown in FIGS. 1A-1C and 2, respectively. The plurality of electrical connections 312 may be through silicon vias (TSVs), conductive vias, electrical vias, or some other type of electrical connection or electrically conductive structure in the substrate 300.

The plurality of electrical connections 312 include surfaces 314 that are at the second surface 304 of the substrate 300. The surfaces 314 of the plurality of electrical connections 312 are substantially coplanar with the second surface 304 of the substrate 300. The surfaces 314 of the plurality of electrical connections 312 may be end surfaces, contact surfaces, vias surfaces, or some other type of surface at the second surface 304 of the substrate 300.

When the electrical connections 312 are TSVs, the TSVs may be formed utilizing a photoresist-etching process and an electroless-plating process, which is carried out after the photoresist-etching process. The photoresist-etching process includes forming a photoresist layer on the second surface 304 of the substrate 300 with openings in the photoresist layer exposing areas of the second surface 304 of the substrate 300. For example, the photoresist layer may be patterned by exposing the photoresist layer to light followed by exposing the photoresist layer to an aqueous solution removing portions of the photoresist layer that have been exposed to the light. Each one of the exposed areas is aligned with a corresponding one of the plurality of conductive pads 308. After forming the photoresist layer with openings, a chemical etching step is performed forming recesses extending into the second surface 304 of the substrate 300 at the openings in the photoresist layer. Each one of the recesses extends to a corresponding one of the plurality of conductive pads 308 and exposes respective surfaces of the conductive pads 308 opposite to the surfaces 310 of the conductive pads 308 at the first surface 302 of the substrate 300. After forming the recesses, the photoresist layer may be removed by exposing the photoresist layer to photons of light. After the photoresist layer is removed, a barrier layer (e.g., oxide layer) may be formed on sidewalls of the recess and a seed layer may be formed on the barrier layer. The barrier layer and the seed layer may be formed by a deposition technique such as a chemical vapor deposition technique, a sputtering technique, or some other deposition technique or combination of deposition techniques. After forming the barrier layer and the seed layer, an electroless-plating step is performed forming a conductive material on the seed layer and filling the opening by attracting the conductive material to the seed layer. The seed layer is made of a material that attracts the conductive material during the electroless-plating process. After the electroless-plating process is completed, the plurality of electrical connections 312 extending into the second surface 304 of the substrate 300 are formed.

When forming the electrical connections 312 as shown in FIG. 3B, the substrate 300 may be coupled to and supported by a temporary carrier or support. The temporary carrier may be a dummy substrate, a dummy wafer, a support tape, or some other type of temporary carrier or support.

Figure 3C:
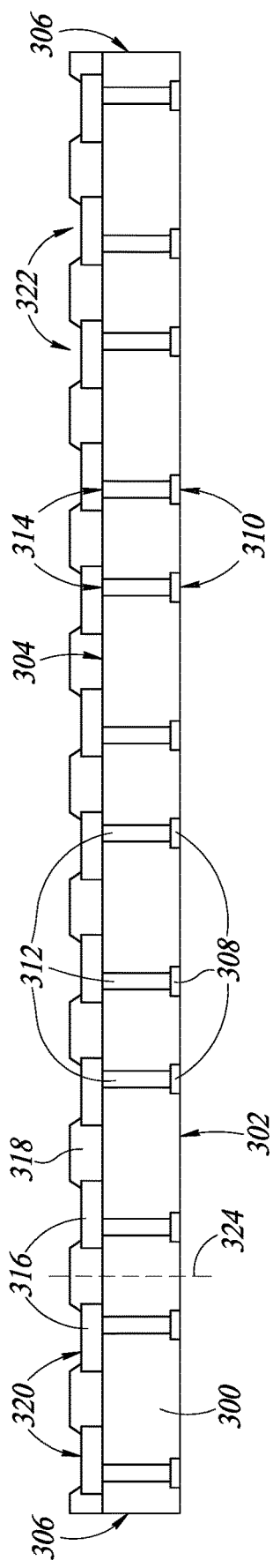

FIG. 3C illustrates a cross-sectional view of a step in the method of manufacturing the interconnect substrate 106 in which a plurality of conductive pads 316, which correspond to the external conductive pads 146 of the interconnect substrate 106, and a non-conductive layer 318, which corresponds to the non-conductive layer 144 of the interconnect substrate 106, are formed on the second surface 304 of the substrate 300. The non-conductive layer 318 partially covers surfaces 320 exposed by openings 322 in the non-conductive layer 318.

Figure 3D:
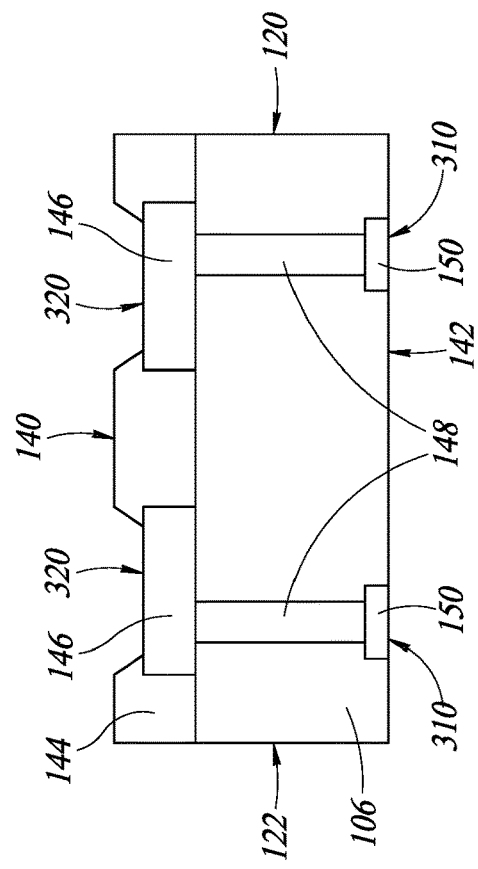

The conductive pads 316 at the second surface 304 of the substrate 300 may be formed by a combination of similar processes as forming the plurality of electrical connections 312. For example, photoresist processes and plating processes may be carried out successively in multiple steps to form the conductive pads 316. The conductive pads 316 may be under bump metallizations (UBMs). While forming the conductive pads 316, the non-conductive layer 318 may be formed successively during the successive photoresist processes and plating processes to electrically insulate adjacent ones of the plurality of conductive pads 316 to avoid short-circuiting or cross talk between adjacent ones of the plurality of conductive pads 316. The non-conductive layer 318 may be a passivation layer, a repassivation layer, an insulating layer, a dielectric layer, or some other type of electrically non-conductive layer. While the non-conductive layer 318 may be a single layer as shown in FIGS. 3C and 3D, in some other embodiments, the non-conductive layer 318 may be a plurality of non-conductive layers stacked on one another. The plurality of non-conductive layers may be passivation layers, repassivation layers, insulating layers, dielectric layers, or some other type or combination of types of electrically non-conductive layers. The conductive pads 316 along with the non-conductive layer 318 may be a redistribution layer (RDL).

After the conductive pads 316 and the non-conductive layer 318 are formed, a singulation process is carried out forming the interconnect substrate 106 as shown in FIG. 3D. For example, a cutting tool (e.g., a saw, a laser, or some other cutting tool) singulates (e.g., cuts, separates, etc.) the substrate 300 and the non-conductive layer 318 along a dotted line 324 forming the interconnect substrate 106 as shown in FIG. 3D. The interconnect substrate 106 as shown in FIG. 3D is the same or similar to the interconnect substrate 106 as shown in the optical sensor packages 100, 200 as shown in FIGS. 1A-1C and 2, respectively. As shown in FIG. 3D, after singulation, the respective first and second sidewalls 120, 122 of the interconnect substrate 106 are made up of respective sidewalls of the non-conductive layer 144 and a portion of the interconnect substrate 106 formed from the substrate 300.

Figure 4C:
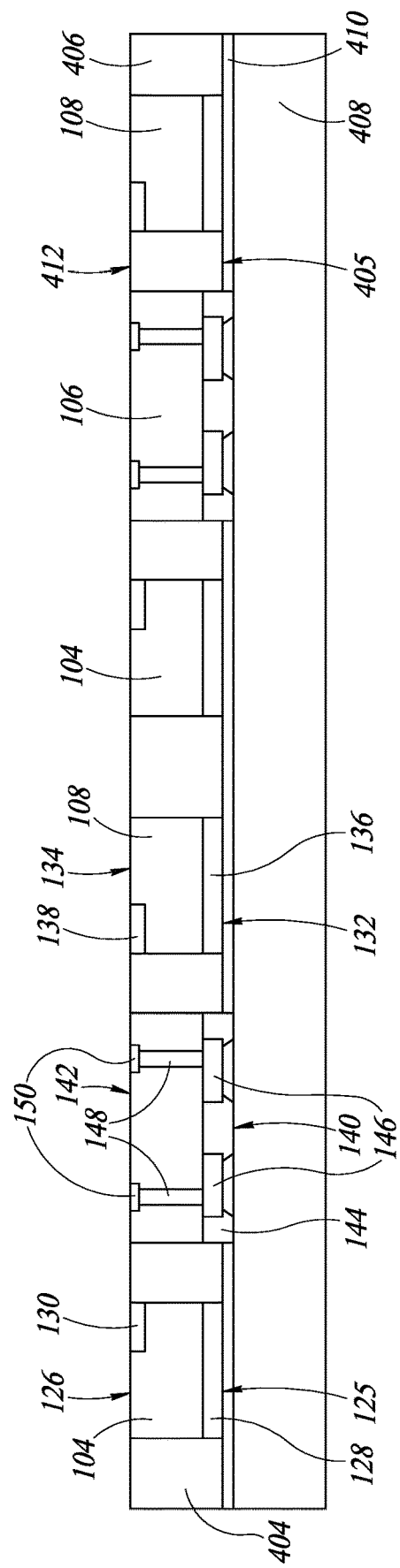

FIGS. 4A-4E are steps in a method of manufacturing the optical sensor package as shown in FIGS. 1A-1C utilizing the interconnect substrate 106 formed by the method of manufacturing as shown in FIGS. 3A-3D. FIG. 4A illustrates a cross-sectional view of a plurality of the light-emitting die 104, a plurality of the interconnect substrate 106, and a plurality of the light-receiving die 108 on a first temporary carrier 400. These pluralities of the light-emitting die 104, the interconnect substrate 106, and the light-receiving die 108 may be arranged in a pattern such as a rectangular array, a circular array, or some other type of array of these pluralities of die 104, 106, 108. For example, adjacent ones of the pluralities of light-emitting die 104, the interconnect substrate 106, and the light-receiving die 108 are spaced apart from each other on the first temporary carrier 400, which will later be filled by a resin material.

These pluralities of the light-emitting die 104, the interconnect substrate 106, and the light-receiving die 108 are coupled to the first temporary carrier 400 by a first temporary adhesive 402 on a surface of the first temporary carrier 400. The first temporary adhesive 402 may be a temporary die attach film, a temporary glue, or some other suitable first temporary adhesive.

The pluralities of the light-emitting die 104, the interconnect substrate 106, and the light-receiving die 108 may be coupled to the first temporary carrier 400 by a pick and place machine. For example, the individual die of the pluralities of the light-emitting die 104, the interconnect substrate 106, and the light-receiving die 108 may be picked up individually in a successive manner and placed on the first temporary adhesive 402 coupling the pluralities of die to the first temporary carrier 400. Alternatively, the pluralities of light-emitting die 104, the interconnect substrate 106, and the light-receiving die 108 may be picked up and placed on the first temporary adhesive 402 at the same time by the pick and place machine.

FIG. 4B illustrates a cross-sectional view of a first resin material 404 formation step in which the first resin material 404 is formed between ones of the pluralities of the light-emitting die 104, the interconnect substrate 106, and the light-receiving die 108 on the first temporary carrier 400. After the pluralities of light-emitting die 104, the interconnect substrate 106, and the light-receiving die 108 are coupled to the first temporary carrier 400, the first resin material 404 is formed between and on respective sidewalls of the respective die of the pluralities of the light-emitting die 104, the interconnect substrate 106, and the light-receiving die 108. The first resin material 404 corresponds to the first resin 102 in the embodiments of the optical sensor packages 100, 200 as shown in FIGS. 1A-1C and 2.

The first resin material 404 may be formed by an injection-molding technique, a compression molding technique, an over-mold and back grinding technique, or some other type of resin material formation technique. For example, when an injection molding technique is utilized, a molding tool is applied to surfaces of the pluralities of light-emitting die 104, the interconnect substrate 106, and the light-receiving die 108 that are facing away from the first temporary carrier 400. After the molding tool is positioned, the first resin material 404 is then injected into gaps or spaces between adjacent ones of the pluralities of the light-emitting die 104, the interconnect substrate 106, and the light-receiving die 108. During this injection process, the first resin material 404 covers the respective sidewalls of the pluralities of the light-emitting die 104, the interconnect substrate 106, and the light-receiving die 108. After the first resin material 404 is injected, the first resin material 404 is cured or hardened. During this curing or hardening process, the molding tool may be removed before the first resin material 404 is fully or completely cured or hardened. The first resin material 404 along with the pluralities of the light-emitting die 104, the interconnect substrate 106, and the light-receiving die 108 form a wafer 406.

A first surface 405 of the first resin material 404 is substantially coplanar with the respective surfaces 126, 132 of the respective conductive pads 128, 136 of the respective light-emitting die 104 and light-receiving die 108. The respective non-conductive layers 144 of the respective interconnect substrate 106 protrude outward from the first surface 405 of the first resin material 404. In some embodiments, the respective surfaces 126, 132 may be recessed within the first resin material 404. In some embodiments, the respective surfaces 140 of the respective interconnect substrate 106, which are surfaces of the respective non-conductive layers 144, may be substantially coplanar and flush with the first surface 405 of the first resin material 404. In some embodiments, the respective surfaces 140 of the interconnect substrate 106 may be recessed within the first surface 405 of the first resin material 404.

FIG. 4C illustrates a cross-sectional view of a flip-chip step in which the wafer 406 is flipped and coupled to a second temporary carrier 408. After the wafer 406 is formed upon completion of curing or hardening the first resin material 404, a flip-chip process is carried out removing the wafer 406 from the first temporary adhesive 402 on the first temporary carrier 400, and the wafer 406 is then transferred to the second temporary carrier 408. During the clip-chip process, the wafer 406 is flipped such that an opposite side is on a second temporary adhesive 410 on the second temporary carrier 408. The opposite side is opposite to a side of the wafer 406 originally on the first temporary adhesive 402 when coupled to the first temporary carrier 400. The second temporary carrier 408 may be the same or similar to the first temporary carrier 400, and the second temporary adhesive 410 may be the same or similar to the first temporary adhesive.

A second surface 412 of the first resin material 404 faces away from the second temporary carrier 408, and the first surface 405 is coupled to the second temporary adhesive 410 on the second temporary carrier 408. The second surface 412 of the first resin material 404 is opposite to the first surface 405 of the first resin material 404. The second surface 412 is substantially coplanar with respective surfaces 126, 134, 142 of the pluralities of the light-emitting die 104, the interconnect substrate 106, and the light-receiving die 108.

Figure 4D:
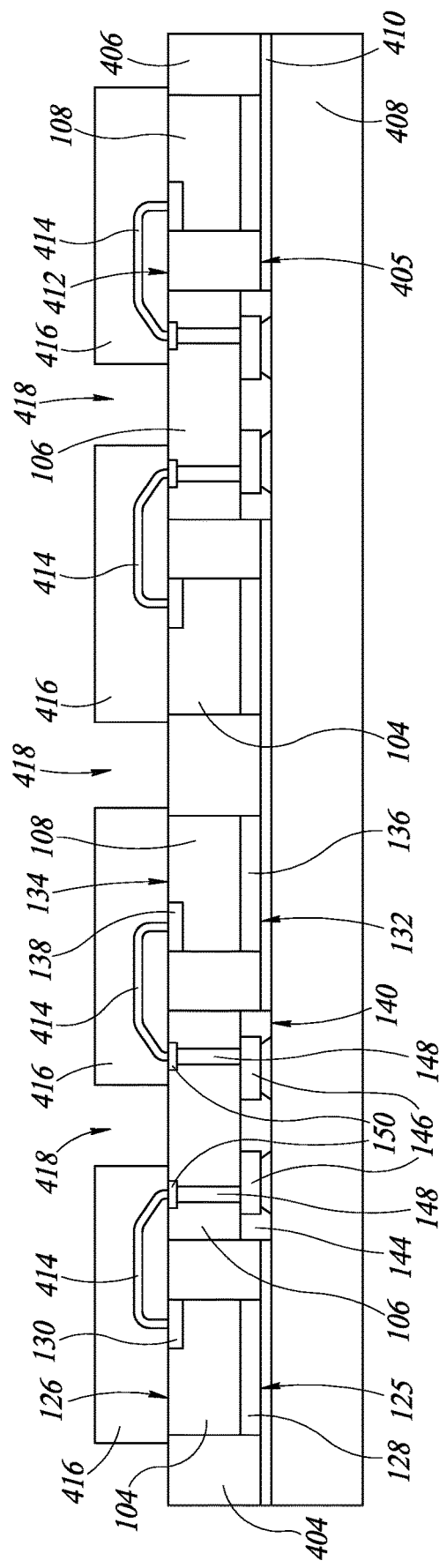

FIG. 4D illustrates a cross-sectional view of an electrical wire formation step followed by a transparent material formation step in which transparent material portions 416 are formed on the wafer 406 in an array pattern. After the wafer 406 has been coupled to the second temporary carrier 408, a wire bonding technique is carried out forming electrical wires 414. The wire bonding technique may be a ball-bond technique, a wedge bond technique, or some other wire bonding technique. At least one of the electrical wires 414 corresponds to the first electrical wire 151 of the optical sensor package 100 as shown in FIGS. 1A-1C, and at least another one of the electrical wires 414 corresponds to the second electrical wire 153 of the optical sensor package 100 as shown in FIGS. 1A-1C. Ones of the electrical wires 414 couple corresponding ones of the pluralities of the light-emitting die 104 to corresponding ones of the pluralities of the interconnect substrate 106. Other ones of the electrical wires 414 couple corresponding ones of the pluralities of the light-receiving die 108 to corresponding ones of the pluralities of the interconnect substrate 106.

The transparent material portions 416 are made of an optically transmissive material such that light photons pass through the transparent material. At least one of the transparent material portions 416 corresponds to the first transparent portion 152 as in the optical sensor package 100 as shown in FIGS. 1A-1C, and at least another one of the transparent material portions 416 corresponds to the second transparent portion 160 in the optical sensor package 100 as shown in FIGS. 1A-1C.

After the electrical wires 414 are formed, the transparent material portions 416 may be formed by an injection-molding technique, a compression molding technique, an over-mold and back grinding technique, or some other type of resin material formation technique the same or similar to the formation of the first resin material 404. For the sake of simplicity and brevity of the present disclosure, the discussion of forming the transparent material portions 416 with the injection molding technique, the compression molding technique, the over-mold and back grinding technique, or some other type of resin material formation technique will not be reproduced herein.

In some embodiments, the transparent material portions 416 may be formed by forming a layer of transparent material on the wafer 406 and then patterning the transparent material with an etching step, a sawing step, a cutting step, a layering step, or some other patterning technique forming recesses 418 between adjacent ones of the transparent material portions 416. The recesses 418 separate and space apart adjacent ones of the transparent material portions 416 from each other, which can readily be seen in FIG. 4D.

In some embodiments, the transparent material portions 416 may be pre-formed beforehand and then attached to the wafer 406 on the first resin material 404 as well as on the pluralities of the light-emitting die 104, the interconnect substrates 106, and the light-receiving die 108 by a transparent adhesive. For example, the transparent adhesive may be placed, formed, or applied to the wafer, at which point a pick and place machine may pick up and place the pre-formed transparent material portions on the transparent adhesive. When the pre-formed transparent material portions 416 technique is utilized, the electrical wire 414 may be replaced by electrical traces on the respective surfaces 126, 134, 142 of the pluralities of the light-emitting die 104, the interconnect substrate 106, and the light-receiving die 108 as well as the second surface 412 of the first resin material 404. For example, the electrical traces may extend through passivation layers formed on the respective surfaces to form electrical connections between the pluralities of the light-emitting die 104, the interconnect substrate 106, and the light-receiving die 108.

In some embodiments, when the pre-formed transparent portions 416 technique is utilized electrical connections such as the electrical wires 414 may be encased within the transparent portions 416 before the transparent portions 416 are attached to the wafer 406 on the first resin 404 as well as the pluralities of light-emitting die 104, the interconnect substrates 106, and light-receiving die 108 by the transparent adhesive.

In this embodiment of manufacturing the optical sensor package 100 as shown in FIGS. 1A-1C, the respective non-conductive layers 144 of the interconnect substrate 106 extend into the second temporary adhesive 410 on the second temporary carrier 408. In some embodiments, when the respective surfaces 140 of the non-conductive layers 144 are substantially coplanar with the first surface 405 of the first resin material 404, the respective surfaces 144 of the non-conductive layers 144 may be on the second temporary adhesive 410 in the same or similar manner as the respective surfaces 125, 132 of respective ones of the pluralities of light-emitting die 104 and the light-receiving die 108.

Figure 4E:
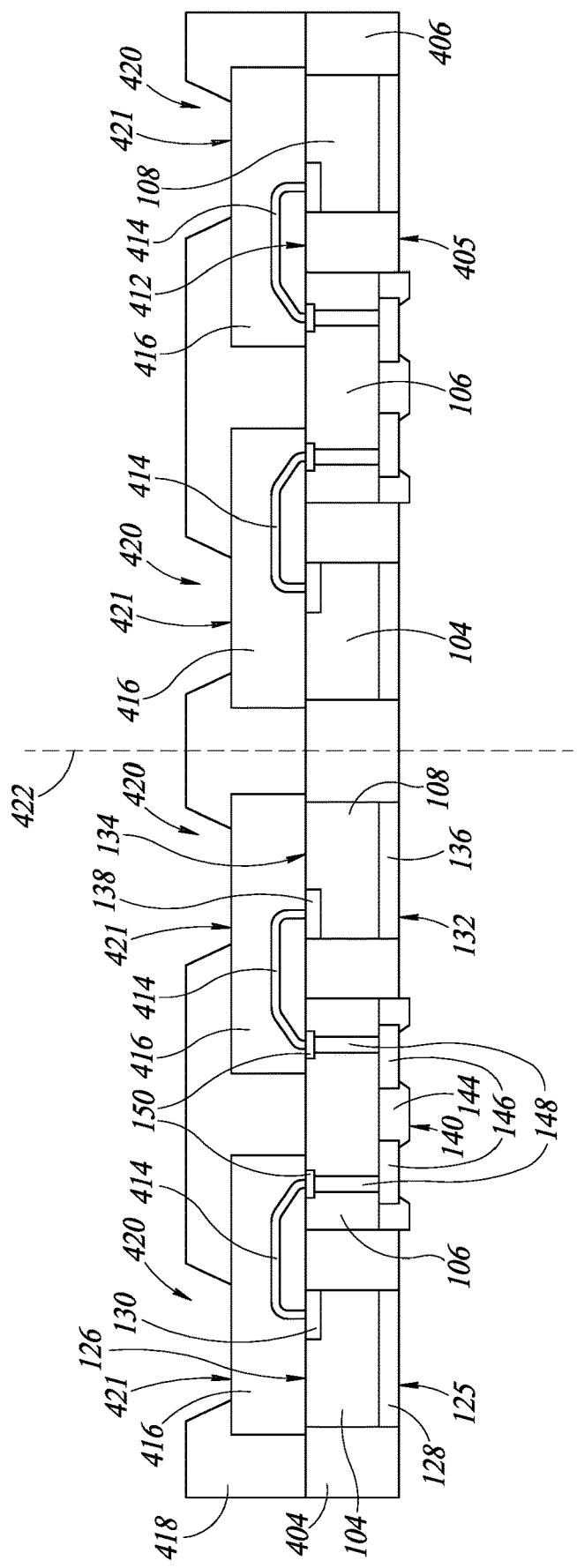

FIG. 4E illustrates a cross-sectional view of a second resin formation step in which a second resin material 419 is formed between adjacent ones of the transparent material portions filling the recesses between the transparent material portions. After the second resin material is formed, a singulation step is carried out in which the various stacked components are removed from the second temporary carrier and second temporary adhesive, and then the stacked layers are singulated (e.g., cut, sawed, lasered, etc.) to form a number of the optical sensor package 100 as shown in FIGS. 1A-1C.

The second resin material 419 may be formed in the same or similar manner as forming the first resin material 404. For the sake of simplicity and brevity of the present disclosure, the formation of the second resin material 419 will not be discussed in further detail herein in view of the previous discussion with respect to forming the first resin material 404 as discussed earlier with respect to FIG. 4B. The second resin material 419 corresponds to the second resin material 168 in the embodiments of the optical sensor packages 100, 200 as shown in FIGS. 1A-1C and 2. In some embodiments, the first and second resin materials 404, 419 may be the same resin material. In some embodiments, the first and second resin material 404, 419 may be different resin materials from each other.

The second resin material 419 includes a plurality of openings or apertures 420. The openings or apertures 420 may be formed at the same time the second resin material 419 is formed. For example, if a molding tool is utilized to form the second resin material 419, the molding tool may have protrusions that contact respective surfaces 421 of the respective transparent material portions 416 such that the second resin material 419 is formed to have the plurality of openings 420. However, in some embodiments, the second resin material 419 may be formed to cover the surfaces 421, and the plurality of openings 420 may be then be formed by an etching step, a cutting step, a lasering step, or some other removal technique removing portions of the second resin material 419 forming the plurality of openings 420. A first number of the plurality of openings 420 are aligned with corresponding ones of the plurality of the light-emitting die 104, and a second number of the plurality of openings 420 are aligned with corresponding ones of the light-receiving die 108. At least one of the openings 420 corresponds to the first opening 174 of the optical sensor package 100 as shown in FIGS. 1A-1C, and at least another one of the openings 420 corresponds to the second opening 176 of the optical sensor package 100 as shown in FIGS. 1A-1C.

After the second resin material 419 is formed, the various stacked layers and components as shown in FIG. 4E are singulated along a dotted line 422. The singulation process is the same or similar to the singulation process as discussed earlier with respect to FIG. 3C. For the sake of simplicity and brevity of the present disclosure, the discussion of singulating these various stacked layers and components as shown in FIG. 4E, which is the same or similar to the singulation process as discussed earlier with respect to FIG. 3C, will not be reproduced herein.

Figure 5:
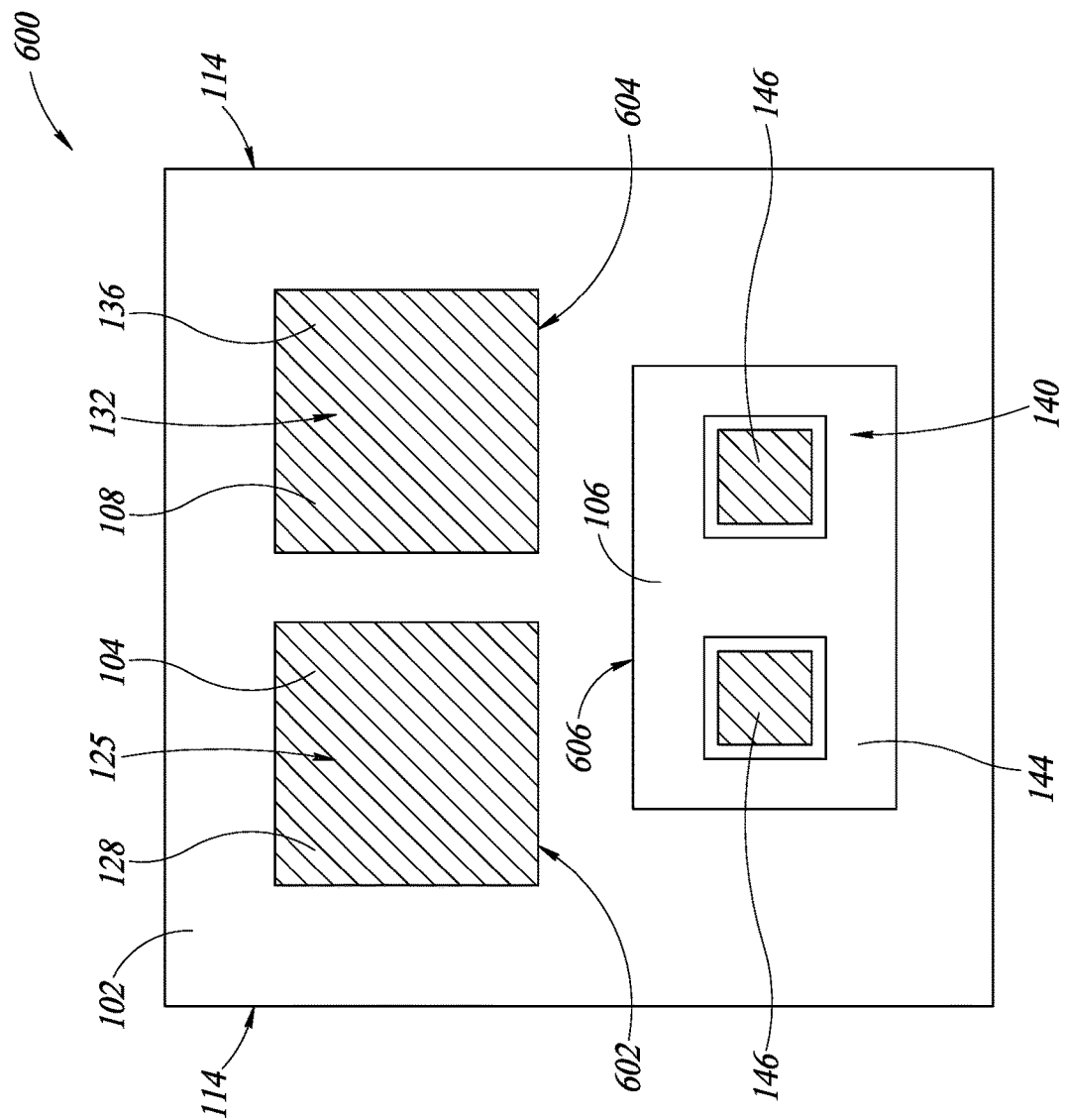
FIG. 5 illustrates a bottom plan view of an alternative embodiment of an optical sensor package.

FIG. 5 is directed to an alternative embodiment of an optical sensor package 600. The same reference numerals will be utilized for features in the optical sensor package 600 as shown in FIG. 5 that are the same or similar to the features of the optical sensor package 100 as shown in FIGS. 1A-1C. Furthermore, for simplicity and brevity of the present disclosure, the description of these same or similar features in the optical sensor package 600 relative to the optical sensor package 100 will not be reproduced herein.

Unlike the optical sensor package 100 as shown in FIG. 1A, the interconnect substrate 106 is not positioned between the light-emitting die 104 and the light-receiving die 108 and does not separate the light-emitting die 104 from the light-receiving die 108. Instead, the interconnect substrate 106 is spaced apart from respective sidewalls 602, 604 of the light-emitting die 104 and the light-receiving die 108. The respective sidewalls 602, 604 face towards a respective sidewall 606 of the interconnect substrate 106. Although not shown, the interconnect substrate 106 as shown in FIG. 5 is electrically coupled to the light-emitting die 104 and the light-receiving die 108. The interconnect substrate 106 may be electrically coupled to the light-emitting die 104 and the light-receiving die 108 in the same or similar manner as shown in FIGS. 1A and 2, in the same or similar manners as discussed earlier within the present disclosure, or by utilizing some other coupling technique. For example, a first electrical wire may extend from the light-emitting die 104 to the interconnect substrate 106 coupling the interconnect substrate 106 to the light-emitting die, and a second electrical wire may extend from the light-receiving die 108 to the interconnect substrate 106 coupling the interconnect substrate 106 to the light-receiving die 108.

In at least one embodiment, similar to the optical sensor package 100, the optical sensor package 600 may include a first transparent portion similar to the first transparent portion 152 and a second transparent portion similar to the second transparent portion 160. The first transparent portion of the optical sensor package 600 extends from the light-emitting die 104 to the interconnect substrate 106 and encases the first electrical wire. The first transparent portion of the optical sensor package 600 is on the light-emitting die 104 and the interconnect substrate 106. The second transparent portion in the optical sensor package 600 extends from the light-receiving die 108 to the interconnect substrate 106 encasing the second electrical wire. The second transparent portion in the optical sensor package 600 is on the light-receiving die 108 and the interconnect substrate 106.

A device of the present disclosure may be summarized including: a first die having a first surface, a second die having a second surface, an interconnect substrate between and coupled to the first die and the second die, the interconnect substrate having a third surface, and a first resin covering respective sidewalls of the first die, the second die, and the interconnect substrate, the first resin spaces apart the first die, the second die, and the interconnect substrate from each other, the first resin includes a fourth surface substantially coplanar with the first, second, and third surfaces.

The interconnect substrate may include a fifth surface opposite to the third surface, a plurality of first conductive pads at the third surface, a plurality of second conductive pads at the fifth surface, and a plurality of electrical connections extend through the interconnect substrate from ones of the plurality of first conductive pads to corresponding ones of the plurality of second conductive pads.

The device may include a first transparent portion on the fourth surface of the first resin, on first surface of the first die, and on third surface of the interconnect substrate, and a second transparent portion on the fourth surface of the first resin, on the second surface of the second die, and on the third surface of the interconnect substrate, the second transparent portion spaced apart from the first transparent portion. The device may include a first wire coupling the first die to the interconnect substrate, the first wire extends through the first transparent portion, and a second wire coupling the second die to the interconnect substrate, the second wire extends through the second transparent portion. The device may include a second resin on the interconnect substrate, the second resin between the first and second transparent portions, and the second resin covers respective sidewalls of the first and second transparent portions. The second resin may physically contact the third surface of the interconnect substrate. The second resin may partially cover respective surfaces of the first and second transparent portions, the respective surfaces face away from the first resin and are transverse to the respective sidewalls of the first and second transparent portions. The device may include a first opening extending into the second resin to the respective surface of the first transparent portion, the first opening aligned with the first die, and a second opening extending into the second resin to the respective surface of the second transparent portion, the second opening aligned with the second die.

The device may include a first transparent portion on the first surface of the first die and on the third surface of the interconnect substrate, a second transparent portion on the second surface of the second die and on the third surface of the interconnect substrate, and a second resin on the fourth surface of the first resin, on the third surface of the interconnect substrate, on respective sidewalls of the first and second transparent portions, and on respective surfaces of the first and second transparent portions transverse to the respective sidewalls of the first and second transparent portions. The second resin may include a first opening exposing the respective surface of the first transparent portion, the first opening aligned with the first die, and a second opening exposing the respective surface of the second transparent portion, the second opening aligned with the second die.

A device of the present disclosure may be summarized including: a first resin having a first surface and a second surface opposite to the first surface, a first die in the first resin and extending from the first surface to the second surface, a second die in the first resin and extending from the first surface to the second surface, an interconnect substrate in the first resin and extending from the first surface to the second surface, the interconnect substrate coupled to the first die and the second die, a first transparent portion on the first die and the interconnect substrate, a second transparent portion on the second die and the interconnect substrate, and a second resin on the first surface of the first resin and on the interconnect substrate, the second resin extending from the first transparent portion to the second transparent portion.

The device may include the first transparent portion encasing a first wire coupling the interconnect substrate to the first die, and the second transparent portion encasing a second wire coupling the interconnect substrate to the second die. The device may include the first resin including a plurality of first sidewalls, and the second resin including a plurality of second sidewalls, each respective second sidewall of the plurality of second sidewalls being substantially coplanar with a corresponding respective first sidewall of the plurality of first sidewalls. The first die may have a first conductive pad at the first surface of the first resin and a second conductive pad at the second surface of the first resin. The second die may have a third conductive pad at the first surface of the first resin and a fourth conductive pad at the second surface of the first resin. The interconnect substrate may have a fifth conductive pad and a sixth conductive pad at the first surface of the first resin, a seventh conductive pad and an eighth conductive pad at the second surface of the first resin, the fifth conductive pad may be coupled to the first conductive pad of the first die by a first wire, and the sixth conductive pad may be coupled to the third conductive pad of the second die by a second wire. The first transparent portion may have a first sidewall on the first resin and a second sidewall opposite to the first sidewall on the interconnect substrate. The second transparent portion may have a third sidewall on the first resin and a fourth sidewall opposite to the third sidewall on the interconnect substrate.

A method of the present disclosure may be summarized including: forming a first resin on respective sidewalls of a first die, a second die, and an interconnect substrate between ones of the respective sidewalls of the first and second die, the interconnect substrate spacing apart the ones of the respective sidewalls of the first and second die, coupling the first die and the second die to the interconnect substrate by a plurality of wires, providing a first transparent portion on the first die and the interconnect substrate, providing a second transparent portion on the second die and the interconnect substrate, and forming a second resin on the interconnect substrate, on the first resin, on the first transparent portion, on the second transparent portion, and between the first and second transparent portions.

The method may include coupling the first die, the second die, and the interconnect substrate to a first temporary carrier positioning the interconnect substrate between the first and the second die. Forming the first resin on respective sidewalls of the first die, the second die, and the interconnect substrate may include forming the first resin on the first temporary carrier, between a first die and the interconnect substrate, and between the second die and the interconnect substrate. Providing the first transparent portion may include encasing a respective wire of the plurality of wires coupling the first die to the interconnect substrate with the first transparent portion. Providing the second transparent portion may include encasing a respective wire of the plurality of wires coupling the second die to the interconnect substrate with the second transparent portion. Forming the second resin on the first transparent portion may include partially covering a surface of the first transparent portion facing away from the first die and the interconnect substrate with the second resin. Forming the second resin on the second transparent portion may include partially covering a surface of the second transparent portion facing away from the second die and the interconnect substrate with the second resin.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a first die having a first surface;
   a second die having a second surface;
   an interconnect substrate between and coupled to the first die and the second die, the interconnect substrate having a third surface;
   a first resin covering respective sidewalls of the first die, the second die, and the interconnect substrate, the first resin spaces apart the first die, the second die, and the interconnect substrate from each other, the first resin includes a fourth surface substantially coplanar with the first, second, and third surfaces;
   a first transparent portion on the fourth surface of the first resin, on the first surface of the first die, and on the third surface of the interconnect substrate; and
   a second transparent portion on the fourth surface of the first resin, on the second surface of the second die, and on the third surface of the interconnect substrate, the second transparent portion spaced apart from the first transparent portion.

2. The device of claim 1, wherein the interconnect substrate further includes:
   a fifth surface opposite to the third surface;
   a plurality of first conductive pads at the third surface;
   a plurality of second conductive pads at the fifth surface; and
   a plurality of electrical connections extend through the interconnect substrate from ones of the plurality of first conductive pads to corresponding ones of the plurality of second conductive pads.

3. The device of claim 1, further comprising:
   a first wire coupling the first die to the interconnect substrate, the first wire extends through the first transparent portion; and
   a second wire coupling the second die to the interconnect substrate, the second wire extends through the second transparent portion.

4. The device of claim 1, further comprising a second resin on the interconnect substrate, the second resin between the first and second transparent portions, and the second resin covers respective sidewalls of the first and second transparent portions.

5. The device of claim 4, wherein the second resin physically contacts the third surface of the interconnect substrate.

6. The device of claim 4, wherein the second resin partially covers respective surfaces of the first and second transparent portions, the respective surfaces facing away from the first resin and being transverse to the respective sidewalls of the first and second transparent portions.

7. The device of claim 6, further comprising:
   a first opening extending into the second resin to the respective surface of the first transparent portion, the first opening aligned with the first die; and
   a second opening extending into the second resin to the respective surface of the second transparent portion, the second opening aligned with the second die.

8. The device of claim 1, further comprising:
   a second resin on the fourth surface of the first resin, on the third surface of the interconnect substrate, on respective sidewalls of the first and second transparent portions, and on respective surfaces of the first and second transparent portions transverse to the respective sidewalls of the first and second transparent portions.

9. The device of claim 8, wherein the second resin includes:
a first opening exposing the respective surface of the first transparent portion, the first opening aligned with the first die; and
a second opening exposing the respective surface of the second transparent portion, the second opening aligned with the second die.

10. A device, comprising:
a first resin having a first surface and a second surface opposite to the first surface;
a first die in the first resin and extending from the first surface to the second surface;
a second die in the first resin and extending from the first surface to the second surface;
an interconnect substrate in the first resin and extending from the first surface to the second surface, the interconnect substrate coupled to the first die and the second die;
a first transparent portion on the first die and the interconnect substrate;
a second transparent portion on the second die and the interconnect substrate; and
a second resin on the first surface of the first resin and on the interconnect substrate, the second resin extending from the first transparent portion to the second transparent portion.

11. The device of claim 10, wherein:
the first transparent portion encases a first wire coupling the interconnect substrate to the first die; and
the second transparent portion encases a second wire coupling the interconnect substrate to the second die.

12. The device of claim 10, wherein:
the first resin includes a plurality of first sidewalls; and
the second resin includes a plurality of second sidewalls, each respective second sidewall of the plurality of second sidewalls being substantially coplanar with a corresponding respective first sidewall of the plurality of first sidewalls.

13. The device of claim 10, wherein:
the first die has a first conductive pad at the first surface of the first resin and a second conductive pad at the second surface of the first resin;
the second die has a third conductive pad at the first surface of the first resin and a fourth conductive pad at the second surface of the first resin;
the interconnect substrate having:
a fifth conductive pad and a sixth conductive pad at the first surface of the first resin;
a seventh conductive pad and an eighth conductive pad at the second surface of the first resin;
the fifth conductive pad is coupled to the first conductive pad of the first die by a first wire; and
the sixth conductive pad is coupled to the third conductive pad of the second die by a second wire.

14. The device of claim 10, wherein:
the first transparent portion has a first sidewall on the first resin and a second sidewall opposite to the first sidewall on the interconnect substrate; and
the second transparent portion has a third sidewall on the first resin and a fourth sidewall opposite to the third sidewall on the interconnect substrate.

15. A device, comprising:
a first side and a second side opposite to the first side;
a first resin at the first side, the first resin including a first surface and a second surface opposite to the first surface;
a second resin on the first resin and at the second side, the second resin including a third surface coupled to the second surface, and a fourth surface opposite to the third surface;
a first die within the first resin, the first die extends from the first surface to the second surface;
a second die within the first resin, the second die extends from the first surface to the second surface;
a third die within the first resin, the third die extends from the first surface to the second surface, and the third die is between the first die and the second die;
a first transparent portion on the first die, on the third die, on the second surface of the first resin, and in the second resin;
a second transparent portion on the second die, on the third die, on the second surface of the first resin, and in the second resin;
a first opening in the second resin exposing a fifth surface of the first transparent portion;
a second opening in the second resin exposing a sixth surface of the second transparent portion;
a first electrical wire extends from the first die to the third die and extends through the first transparent portion, the first electrical wire electrically couples the first die to the third die; and
a second electrical wire extends from the second die to the third die and extends through the second transparent portion, the second electrical wire electrically couples the second die to the third die.

16. The device of claim 15, wherein:
the first die is a light emitting die;
the second die is a light receiving die; and
the third die is an interconnect die.

17. The device of claim 15, wherein:
the first die includes a first contact pad exposed from the first surface of the first resin;
the second die includes a second contact pad exposed from the first surface of the first resin; and
the third die includes a first conductive pad and a second conductive pad exposed from the first surface of the first resin.

18. The device of claim 17, wherein:
the first conductive pad is in electrical communication with the first die along a first electrical pathway including the first electrical wire; and
the second conductive pad is in electrical communication with the second die along a second electrical pathway including the second electrical wire.

19. The device of claim 17, wherein the first contact pad and the second contact pad are larger than the first conductive pad and the second conductive pad.

* * * * *